(12) United States Patent
Zimmerman et al.

(10) Patent No.: US 8,298,840 B2
(45) Date of Patent: Oct. 30, 2012

(54) DUAL SIDED PROCESSING AND DEVICES BASED ON FREESTANDING NITRIDE AND ZINC OXIDE FILMS

(75) Inventors: Scott M. Zimmerman, Basking Ridge, NJ (US); Karl W. Beeson, Princeton, NJ (US); William R. Livesay, San Diego, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

(21) Appl. No.: 13/068,263

(22) Filed: May 6, 2011

(65) Prior Publication Data

US 2011/0284066 A1    Nov. 24, 2011

Related U.S. Application Data

(63) Continuation of application No. 12/590,196, filed on Nov. 4, 2009, now Pat. No. 8,017,415.

(60) Provisional application No. 61/198,484, filed on Nov. 5, 2008.

(51) Int. Cl.
*H01L 21/00* (2006.01)

(52) U.S. Cl. ........... 438/22; 438/46; 438/47; 438/48; 438/85; 438/93; 257/76; 257/194; 257/201; 257/E29.091; 257/E29.317; 257/E21.121; 257/E21.125; 257/E21.131

(58) Field of Classification Search ............ 257/76, 257/194, 201, E29.091, E29.317, E21.121, 257/E21.125, E21.131; 438/22, 46, 47, 48, 438/85, 93

See application file for complete search history.

(56) References Cited

U.S. PATENT DOCUMENTS

| | | | |
|---|---|---|---|
| 4,136,435 A | 1/1979 | Li | |
| 4,445,132 A | 4/1984 | Ichikawa et al. | |
| 4,456,490 A | 6/1984 | Dutta et al. | |
| 6,087,680 A | 7/2000 | Gramann et al. | |
| 6,559,075 B1 * | 5/2003 | Kelly et al. | 438/795 |
| 6,683,416 B1 | 1/2004 | Oohata et al. | |
| 7,033,961 B1 | 4/2006 | Smart et al. | |
| 2002/0182889 A1 | 12/2002 | Solomon et al. | |
| 2008/0182353 A1 | 7/2008 | Zimmerman et al. | |
| 2008/0258165 A1 | 10/2008 | Zimmerman et al. | |
| 2009/0140272 A1 | 6/2009 | Zimmerman et al. | |
| 2009/0140279 A1 | 6/2009 | Zimmerman et al. | |

* cited by examiner

*Primary Examiner* — Long Tran

(74) *Attorney, Agent, or Firm* — William Propp

(57) ABSTRACT

Thin freestanding nitride films are used as a growth substrate to enhance the optical, electrical, mechanical and mobility of nitride based devices and to enable the use of thick transparent conductive oxides. Optoelectronic devices such as LEDs, laser diodes, solar cells, biomedical devices, thermoelectrics, and other optoelectronic devices may be fabricated on the freestanding nitride films. The refractive index of the freestanding nitride films can be controlled via alloy composition. Light guiding or light extraction optical elements may be formed based on freestanding nitride films with or without layers. Dual sided processing is enabled by use of these freestanding nitride films. This enables more efficient output for light emitting devices and more efficient energy conversion for solar cells.

11 Claims, 21 Drawing Sheets

DUAL SIDED PROCESSING AND DEVICES BASED ON FREESTANDING NITRIDE AND ZINC OXIDE FILMS

REFERENCE TO PRIOR APPLICATION

This application is a continuation of prior U.S. patent application Ser. No. 12/590,196, filed on Nov. 4, 2009, now U.S. Pat. No. 8,017,415, and claims the benefit of U.S. Provisional Patent Application Ser. No. 61/198,484, which was filed on Nov. 5, 2008, which is herein incorporated by reference.

BACKGROUND OF THE INVENTION

Semiconductor devices are used in a wide variety of applications. Silicon has been used as the substrate material of choice due to cost and availability of single crystal silicon wafers. Driven by the microelectronic industry silicon wafer production has enabled the economical use of larger wafers with greater than 12 inch diameter. The low cost of silicon allows thick (1-2 mm) single crystal silicon wafers to be used without a secondary substrate for handling and processing. This enables the formation of large area die, which can be processed without the need for transfer substrates or wafer bonding. Additionally, the properties of silicon permit wafers to be doped so that 3 dimensional devices (via planar processing) can be created taking advantage of the wafer conductivity. For some devices it is desirable to utilize thinning techniques to reduce the overall thickness of the silicon to tens of microns to improve thermal performance. Although silicon has been the dominant material for most microelectronic applications there are other materials, which have desirable properties and advantages over silicon in the areas optoelectronics, solar cells and power devices. However, heretofore there has not been an economical solution to using these materials without growing them or attaching them to secondary substrates.

Silicon also has limitations with regard to operating temperature as well as other critical material parameters; this limits silicon's usefulness in optical, power and high-frequency applications. Nitride alloys and oxide alloys have several properties, which are superior to silicon ranging from higher thermal conductivity to biocompatibility. Unfortunately, nitrides are not available in wafer form at a reasonable price or reasonable quality. Even if such wafers were to become available, costly growth, dicing, and thinning techniques would be required to create useful devices. In most cases, devices with an overall thickness between 20 and 150 microns are desired from a thermal impedance, packaging, and optical efficiency standpoint. As such, film based processing offers several advantage over bulk wafer approaches. As the solar industry has discovered film and foil based processing is much more cost effective than wafer based approaches if high resolution lithography is not required. The need exists for cost effective thin nitride films, but also for the ability to process both sides of these films for the formation of waveguides, edge emitters, and symmetric device structures.

In copending patent applications, it has been shown that stacked LEDs, solar cells, and other optoelectronic devices based on freestanding nitride films offer significant advantages from the standpoint of current spreading, functionality, color combining, and peak drive levels. Nitride alloys and zinc oxide alloys offer a unique set of properties with regard to optical, electronic and optoelectronic devices. Further, it has been shown that freestanding nitride films, which exhibit alpha less than 1 cm−1 throughout the visible spectrum, can be created with thicknesses ranging from 20 microns to over 100 microns, which also exhibit resistivities less the 0.05 ohm cm and a thermal conductivity approaching 200 W/m/K with sufficient areas to enable device fabrication. This unique combination of properties at a thickness and area sufficient for handling and subsequent processing permits unique processing techniques including dual sided processing.

As disclosed previously, the use of freestanding nitride films containing MQW structures can be used to create isotropic light sources and the use of stacked freestanding nitride films with different MQW structures can be used to create isotropic white light sources. The combination of these devices with solid wavelength conversion materials has also been disclosed in a pending patent application. However to fully take advantage of these unique attributes, the need exists for low cost processes and materials, which can be used to create devices based on freestanding nitride films.

In particular, the need exists for techniques whereby processing including but not limited to epitaxial growth, deposition, laser patterning, printing, and various interconnect means can be done on one or both sides of freestanding nitride films for the formation of 3 dimensional devices and dual side processes. Zinc oxide alloys can be used to create 3 dimensional devices based on similar material properties to nitrides. While native ZnO wafers have been fabricated, their cost is restrictive and they lack a suitable/stable p-dopant which limit their applications. The combination of nitride alloys and zinc oxide alloys can be used to create a wide variety of high performance electrical and optoelectronic devices. Therefore there is a need for economical processes and means to create 3 dimensional devices based on nitride alloys and/or zinc oxide alloys and combinations of the two materials sets. In this manner, a wide range of hybrid devices can be realized.

While wafers offer significant advantages to high-resolution circuitry as used in microprocessors and memory devices, which require up to 50 masking steps, many applications do not require high-resolution lithography steps. In some cases, processing round wafers is actually a disadvantage or limitation to be overcome. As an example, solar cells are made in ribbon and large area formats. Alternately, liquid crystal displays contain semiconducting active-matrix backplanes are grown on large glass plates that measure four to 6 feet in dimension. Unlike the semiconductor industry, the thick film industry tends to use square substrates, which are more compatible with the printing techniques typically used to form patterned conductors and dielectrics. Square, ribbon and tape based substrates have less edge loss than yields on round wafers.

In addition, the formation of non-circular devices offers several advantages with regard to device performance. There is the potential to reduce stress and enhance extraction efficiency where the edges of the devices are aligned to natural cleavage planes. Triangular shaped die can be effectively utilized to form recycling light cavities, which can enhance radiance to light emitting diode light sources. In copending patent applications methods of forming large area nitride layers based on the removal of thick HVPE epitaxial layers from sapphire substrates are shown. The resulting freestanding foil substrates enable increased flexibility in packaging and device design. The need therefore exists for methods and articles, which take advantage of these freestanding nitride films and provide techniques for processing into devices, which take advantage of the material, geometry, thermal mass, and flexibility of these freestanding nitride films.

These freestanding films offer several advantages over nitride layers which are transferred to a secondary substrate via waferbonding techniques, and over films which remain on their growth substrate like sapphire or silicon carbide, and over diced and polished nitride wafers.

In the case of waferbonded films, stresses created during the original growth process are transferred via the wafer bonding process. Also the resulting structure suffers from poor thermal performance, thermal expansion mismatch which limits operating range. Typically the these nitride layers are thin (~3 microns) which can impact packaging processes such as wirebonding to electrical contacts on the device. This is due to the fragile nature of the thin nitride film, requiring reduced bonding forces to prevent cracking of the nitride layer. This lowers yield in final device fabrication. The lower permissable operating temperature range due to the use of secondary substrates used in waferbonding not only limits device operation but also prevents the use of robust materials such as glass fits and fired contacts that can enhance packaging reliability but require high temperature processing.

With these prior art methods, nitride films left on their growth substrate must be thin to prevent bowing either at room temperature or at high temperature growth conditions. The low thermal conductivity of sapphire in particular limits device performance and also typically requires wafer thinning processes, which increase costs. Also, the inability to create a vertical structure for non-conductive growth substrates like sapphire limit the ability to form vertical structures or stack nitride films, which can result in new and novel devices.

Another prior art technique to form freestanding nitride substrates is to grow thick nitride layers on secondary substrates, followed by dicing and polishing to eliminate the secondary substrate. This has proven to be a very costly process and by necessity has size limitations. Further, defects introduced via dicing and polishing and the inclusion of stresses due to the dicing processes limit the yield and viability of this approach. In these prior art techniques dual sided processing is impossible or very difficult. However, dual sided processing could offer unique advantages and lead to new types of devices.

It would be desirable to have the ability to grow a variety of structures on a wafer level and then form a freestanding nitride film, which can be further processed on one or both sides. This could offer significant packaging and device flexibility. Alternately, the ability to grow directly on freestanding nitride films could offer many benefits including but not limited to; lower stress growth, dual side processing, low thermal mass and flexible substrates.

In copending patent applications we have shown where freestanding thick (15 to 150 micron thick) nitride layers can be formed with sufficient area and low cost. These layers have an epitaxial ready surface, can be stacked, and can be stress relieved either by allowing the films to bow or be subjected to high temperature annealing processes, once free of the growth substrate. In addition, features and additional layers can be added to one or both sides of the freestanding films. These freestanding nitride and oxide films can be processed on both sides at temperatures over 700 degrees C. enabling the use of thick film processes developed by the solar industry. The use of high temperature thick film processes to form LEDs, diodes, optoelectronic devices, Mems, solar cells and other semiconducting devices could benefit by dual sided processing. In addition, it would be possible to take advantage of the low thermal mass of thin freestanding nitride foils to enhance the epitaxial device growth process.

SUMMARY OF THE INVENTION

This invention discloses methods and articles based on large area freestanding nitride films. These freestanding nitride films enable dual sided processing, improved crystal quality, reduced growth cycles and novel packaging not possible with more conventional template, transfer and bulk wafer approaches. Several attributes of freestanding nitride films are important aspects of this invention including flexibility, low thermal mass, thickness, crystal quality, epitaxial-ready surface, and low stress. The intent of this invention is to disclose methods and articles which take advantage of these attributes of these freestanding nitride foils in LEDS, Laser diodes, solar cells, power devices, rf devices, and 3D semiconductor devices. More preferably, the use of these films with thickness greater than 10 microns in semiconductor devices is disclosed. Even more preferably freestanding nitride films with thickness greater 20 microns but less than 150 microns is disclosed. Most preferred is freestanding nitride films with a thickness between 20 and 70 microns and an area greater than 1 mm2. These freestanding nitride films can be coated, handled, segmented, printed on, grown on (epitaxially and non-epitaxially) and processed at elevated temperatures. This invention also discloses the formation of optoelectronic devices on freestanding nitride films greater than 10 μm thick with epitaxially grown transparent conductive layers greater than 5000 Angstroms. By using epitaxially grown transparent conductive oxides, thicker layers with lower absorption, better current spreading, ESD protection, and lower contact resistance can be formed than using non-epitaxial approaches. The use of epitaxial growth of MOCVD doped ZnO alloys on one or both sides of a freestanding nitride films is a preferred embodiment of this invention.

In addition, the use of thick transparent conductive oxides to enhance the structural integrity of the freestanding nitride films for improved handleability is also disclosed. Preferably, the formation of greater than 5000 Angstroms of a transparent conductive oxide (TCO) on one or both sides of a freestanding nitride film is preferred embodiment of this invention. Even more preferred, is the formation of greater than 5000 Angstroms of a TCO on both sides of a freestanding nitride foil. These layers can be used to inhibit fracture as well as provide interconnect to the underlying device structure.

The use of high temperature annealing steps for the freestanding films after removal of the growth substrate is an embodiment of this invention. The use of high temperature annealing steps after removal of the growth substrate and at least one side coated with a transparent conductive oxide is also disclosed.

The use of these films to form semiconductor devices is an embodiment of this invention. In this manner very low Vf devices can be formed without the need for rapid thermal annealing.

By eliminating the need for rapid thermal annealing, high reflectivity ohmic contacts can be readily formed. Typically complex metallization steps are required due to the degradation typically induced by the rapid thermal annealing steps. The epitaxial growth of the transparent conductive layer may be on one or both sides of the large area freestanding nitride film.

By epitaxially growing a thick transparent conductive layer, several device parameters are improved significantly. These include mechanical integrity, turn-on voltage, contact resistance, ESD stability, and the ability to form ohmic contacts.

Optoelectronic devices, not limited to, LEDs, laser diodes, solar cells, biomedical devices, thermoelectrics, and other optoelectronic devices that are fabricated on these freestanding nitride films are embodiments of this invention. The growth of these devices on freestanding nitride films is a preferred embodiment of this invention. The low thermal mass of the freestanding nitride films allow for the use of rapid thermal processing methods in epitaxial device growth in particular. Freestanding nitride films are flexible, single crystal, high temperature, chemically stable, and exhibit low thermal mass, which makes them ideally suited for a wide range of epitaxial and non-epitaxial processes. Not only do freestanding nitride films provide enhanced growth substrates for transparent conductive oxides (TCOs) but they also can be used to enhance the quality of a wide range of subsequent epitaxial growths including but not limited to nitride alloys, silicon, antimonides, germanium, and other important semiconductors. In particular, freestanding nitride films with a thickness between 20 and 150 microns are flexible and exhibit very low thermal mass, which are shown to enhance subsequent epitaxial growth steps. The flexible nature of these films, can reduce the stress and also improve crystal quality during subsequent epitaxial growths. This can enhance the optical properties of the TCOs. In addition, the low thermal mass of the freestanding nitride films allows for high temperature processing not permissible with conventional nitride fabrication processes. These freestanding nitride films can be fabricated to exhibit absorption coefficients less than one per centimeter over the operational range of the target device or be made to be strongly absorbing depending on the alloy composition.

In addition, the refractive index of the freestanding nitride films can be controlled via alloy composition. The formation of light guiding or light extraction optical elements based on freestanding nitride films with or without layers is an embodiment of this invention.

Alternately, the mechanical properties of the freestanding films can be useful for applications such as bimorphs, unimorphs, cantilevers, micro-actuators and other MEMS type devices. The formation of layers on one or both sides of the freestanding nitride films for mechanical and/or acoustomechanical applications is disclosed.

A preferred embodiment of this invention are nitride alloys which contain but are not limited to AlGaN, InGaN, AlInGaN, GaN, AlN, InN, InAlN as well as P and As alloys typically referred to as dilute nitrides. The modification of the resulting freestanding films via etching, mechanical means, laser, and other techniques known in the art to reduce thermal conductivity, create optical structures, form composites for optoelectronic, thermoelectric, solar, and/or piezoelectric devices is an embodiment of this invention.

With regard to transparent conductive layers, most preferred, is the use of oxide alloys of zinc formed via MOCVD as transparent conductive layers.

The use of dopants to impart luminescent, n doping, p doping, semi-insulating and degenerative properties are also included in the configurations listed. In particular, the use of Al, Ga, and Mg to form highly conductive transparent layers as dopants or alloys to ZnO is an embodiment of this invention.

The use of freestanding nitride films as a growth substrate to enhance the optical, electrical, mechanical and mobility of thick transparent conductive oxides is an embodiment of this invention. In the prior art there have been efforts to grow low defect density GaN on silicon versus sapphire. This has not been successful resulting in much higher defect density films. In this invention it has been found that the quality of Al doped ZnO grown on freestanding nitride films is inherently higher than when the nitride films is still attached to a sapphire substrate. The constrained nature of the nitride on sapphire or any other growth substrate including MN negatively affects the subsequent growth of the ZnO layers. This translates into better ohmic contacts and better optical properties, which in turn lead to better device performance. In addition the use of the excess gallium formed during laser separation to further dope the transparent conductive oxide is beneficial to the resulting properties of the film. The ability to epitaxially grow high quality transparent conductive layers with very good optical properties also enables the use of high temperature and/or high energy processes. As an example laser welding of silver and aluminum ribbon direct to 1.5 micron thick ZnO has been demonstrated with very low contact resistance and is an embodiment of this invention.

In addition, epitaxial growth on freestanding nitride films allow for the growth of high quality highly doped degenerative layers which can be used for improved current spreading and ohmic contacts to a wide variety of optoelectronic devices. Unlike amorphous and polycrystalline growths (typically used to deposit these layers) the MOCVD process used herein provides not only high electrical conductivity, but also provides very low optical absorption losses.

In addition, the use of zinc oxide MOCVD layers on freestanding gallium nitride creates a tough outer skin, which reduces cracking due to crystal plane differences between the two materials. The use of zinc oxide MOCVD layers on one or both sides of the freestanding nitride layers is an embodiment of this invention. The zinc oxide exhibits a lower refractive index then gallium nitride. As such, the use of zinc oxide layers as index matching, cladding layers, and other optical elements is an embodiment of this invention.

Thick freestanding nitride films allow for unique packaging and device fabrication. In particular, freestanding nitride layers can be easily cut, patterned, and perforated using laser and other actinic radiation sources. The formation of multiple layer devices is an embodiment of this invention. This includes but is not limited to, multi-layer interconnects, heat sinks, micro-optical devices, LED arrays, and solar cells.

The use of degenerative highly doped transparent conductive layers, like but not limited to aluminum doped zinc oxide, enable the formation of stacked layers which can be electrically connected either across the entire area of each layer or spatially selectively attached. The ability to form 3 dimensional devices and circuits using freestanding nitride films and transparent conductive layers is an embodiment of this invention.

As current density increases on devices like LEDs, current spreading becomes a limiting factor in device performance especially for large area devices. In co-pending patent applications, freestanding nitride films on which MQWs are grown can be stacked and interconnected. By using the highly transparent conductive layers described herein, emitting volumes can be formed. Rather than have a very large die with large variations in drive currents across the die, stacked die can not only improve the current spreading across a given area but increase the lumens/etendue or radiance of the device. Similarly, this same technique can be use to form more efficient and concentrated solar cells and electronic devices such as IGFETS. With nitrides, current spreading limitations tend to be more severe than thermal effects, therefore volume emitters tend to be more efficient than surface emitters. Low absorption and high quality ohmic contacts are required to enable volume emitters like these. The use of epitaxially grown transparent conductive layers on freestanding nitride films stacked to form volume emitters, absorbers, and electrical devices is an embodiment of this invention.

Geometry plays a critical role in volume emitters versus surface emitters. Here is a simple example: A typical nitride LED less than 10 microns in thickness and 300 micron×300 micron in area has an emitting area equal to 0.09 mm$^2$. If the same size die is 100 micron thick there is more emitting area, 0.12 mm², on the sides of the die than the top surface. There are a number of advantages to this configuration. It is well known that recombination losses are minimized directly under electrical contacts on LEDs. Utilizing large reflective contacts on the top and bottom of the freestanding nitride LED enable very high extraction efficiency out the sides of the die This extraction efficiency is further enhanced by the tendency for a substantial portion of the light generated within the active layer to be waveguided to the edges. The use of thick freestanding nitride films to create LEDs in which the output area of the surface normal to the active layer plane is larger than the output area of the surface parallel to the active layer plane is an embodiment of this invention. Further, the use of stacks of freestanding nitride films to create emitter or absorbing volumes to take advantage of the increased side output area is an embodiment of this invention. The formation of opaque reflective contacts on both surfaces parallel to the active layer plane to further increase thermal cooling and current injection and permit the light to exit or enter via the surfaces normal to the active layer plane are embodiments of this invention.

The thickness of the freestanding nitride film is a critical element in overall device performance. While a reasonable thickness is required to enable: handleability, permit low defect density, and optimum device geometry, there are several device performance attributes, which require the freestanding nitride film to be as thin as possible. These attributes include cost, thermal impedance, series resistance, ease in forming high resolution vias and interconnects, flexibility, and low internal absorption losses. Another key attribute is the ability to rapidly change temperature during growth processes. Nitride templates grown on non-native growth substrates significantly limit allowable growth conditions due to bowing and cracking due to the mismatch of thermal properties of the two materials. Freestanding nitride films not only eliminate these effects but also enable the use of rapid thermal processing steps for the formation of quantum wells (QW), multiple quantum wells (MQW), superlattice and other epitaxial structures which require rapid large transitions in reactor growth temperatures. Many nitride devices require a large number of layers to be grown sequentially in the reactor. Therefore, reduction in the growth time or transition times of each layer can significantly impact overall device cost. Freestanding nitride films not only have inherently lower thermal mass than the more conventional wafer based approaches, nitrides have lower specific heats than sapphire, silicon, and SiC. This can enable the use of higher growth rates while maintaining layer composition and thickness control.

DETAILED DESCRIPTION OF THE INVENTION

Figure 1A:
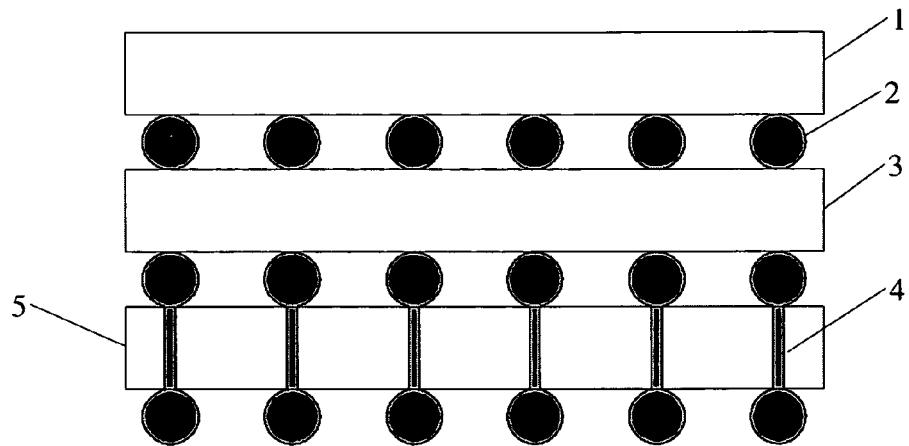
FIG. 1A depicts the prior art of a three dimensional device based on stacked silicon chips.

FIG. 1A depicts a typical prior art three-dimensional device based on stacked silicon chips. Thinning is used to reduce the device thickness for both via formation, overall device thickness and thermal performance. This technique is used especially for memory devices to increase the amount of memory that can be contained within a given footprint. Memory layers 1, 3, and 5 are typically freestanding silicon films which are physically and electrically connected via interconnects 2. In this case, a via 4 may be used through the freestanding silicon films such that a high level of interconnect is created. However, the thinning processes used (polishing, etching, etc) negatively impact overall process yield and ultimate device cost.

Figure 1B:
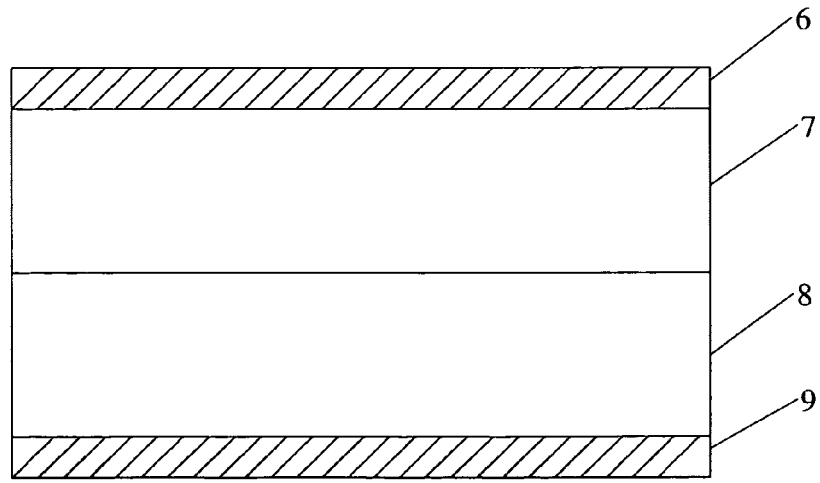
FIG. 1b depicts a prior art process of forming a large area diode.

FIG. 1B depicts a prior art technique to form a large area diode by using n doped layer 7 and p doped layer 8 with contacts 6 and 9. The resulting PN junction can be formed by growing n doped layer 7 or p doped layer 8 on the other layer or may be formed by waferbonding a freestanding n doped layer 7 to a p doped layer 8. In this manner very large area devices can be formed. However, waferbonding adds costly process steps and impacts yield and device cost.

Figure 2A:
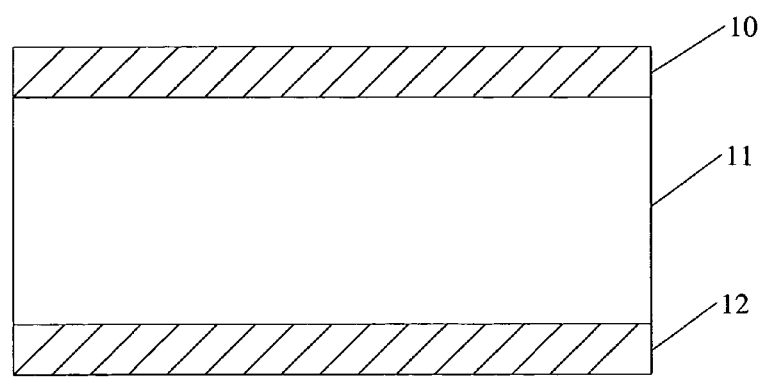
FIG. 2A depicts a process of this invention to fabricate devices using a freestanding nitride film with layers on both sides of the freestanding film.

FIG. 2A depicts a freestanding nitride film 11 of the present invention with top or first layer 10 on the upper surface of the nitride film and bottom or second layer 12 on the lower surface of the nitride film. Freestanding nitride film 11 may consist of nitride alloys and/or zinc oxide alloys. Freestanding nitride film 11 most preferably consists of a nitride alloy. Even more preferred, the freestanding nitride film consists of GaN. Freestanding nitride film 11 may be doped, undoped and semi-insulating. Polar, non-polar, and semi-polar orientations of the nitride layer may also be used. Most preferred are freestanding nitride film 11 consisting of polar GaN uniformly doped with Si. Doping concentrations between $10^{16}$ $cm^{-3}$ and $10^{20}$ $cm^{-3}$ are an embodiment of this invention. A freestanding nitride thickness between 10 and 150 microns is a preferred embodiment of this invention. Most preferably thicknesses between 20 and 70 microns is disclosed to maintain reasonable flexibility while offering sufficient thickness to reduce defect density below $10^8$ $cm^2$. In a preferred method, the formation of top layer 10 is deposited via a deposition process including, but not limited to MOCVD, HYPE, MBE, CVD, sputter, evaporative, spincoating and other deposition techniques as known in the art, on freestanding nitride film 11. Top layer 10 may consist of but not limited to oxides, nitrides, silicon, antimonides, metals, dielectrics and other semiconductor materials. Preferred is epitaxial growth of top layer 10 via MOCVD, HYPE, MBE, CVD or other deposition method on freestanding nitride film 11. Bottom layer 12 may also consist of but not limited to oxides, nitrides, silicon, antimonides, metals, dielectrics and other semiconductor materials. Preferred is epitaxial growth of bottom layer 12 via MOCVD, HYPE, MBE, CVD or other deposition method on freestanding nitride film 11. Top layer 10 and bottom layer 12 may be deposited separately or at the same time. Top layer 10 and bottom layer 12 may be uniform or structured, including multilayered, superlattices, quantum dots, or composites. A preferred embodiment of this invention is the epitaxial growth of semiconductor layers for use in devices including but not limited to, LEDs, EELEDs, laser diodes, solar cells, photoelectrochemical cells, rf devices, and power devices in either or both top layer 10 and bottom layer 12. Multiple coating steps for either or both top layer 10 and bottom layer 12 may be added to create the desired device structure. As an example, on freestanding nitride film 11, a first top layer 10 may be epitaxial grown via MOCVD consisting of at least one InGaN/GaN quantum well layer, followed by a p doped AlGaN barrier layer, followed by a p doped GaN layer, followed by an additional top layer electrical contact layer 10 consisting of a TCO consisting of but not limited to AZO, ITO, IZO, GIZO, GAZO, and other conductive oxides. In this example, bottom electrical contact 12 may optionally be grown on the other side of freestanding nitride film 11. Alternately, metal electrical contacts layer may be added to top layer 10 and bottom contact 12 to enhance current spreading. In this manner a freestanding nitride film based LED, solar cell, rf device, or power device can be formed without any additional support layers. A preferred embodiment is a device in which the last top layer 10 and last bottom layer 12 consists of Al doped ZnO with an Al doping concentration greater than $10^{19}$ $cm^{-3}$ and a thickness greater than 3000 Angstroms grown via MOCVD on freestanding nitride film 11. The resulting TCO layers exhibit lower absorption losses while maintaining high electrical conductivity than amorphous, sputtered, or other non-epitaxially grown layers in thick layers. Layer thickness is critical for ESD and other considerations. The growth of solar cell layers in top layer 10 and/or bottom layer 12 on freestanding nitride film 11 is also a preferred embodiment. Even more preferred is the growth of at least one solar cell layer on top layer 10 which is responsive to short wavelengths of the solar spectrum and the growth of at least one solar cell layer on bottom layer 12 which is responsive to longer wavelengths of the solar spectrum. As an example, a InGaN/GaN solar cell junction is grown via MBE for the first top layer 10 followed by a second top layer 10 consisting of but not limited to AZO or other transparent conductive oxide, this is then followed by a Si, Ge, or other low bandgap solar cell junction grown for bottom layer 12. In this case the order of growth is important because this approach overcomes the issue of degrading the lower temperature low bandgap junctions when higher temperature nitride solar cells layers are grown on low bandgap materials as performed in prior art approaches. In prior art approaches a solar cell is formed by forming a PN junction in silicon (long wavelength sensitive) and then growing a nitride PN junction on top of the silicon. However, the nitride processes require higher temperature than the silicon formed PN junction such that the subsequent processing can degrade the silicon PN junction performance. Using the process of this invention thin flexible high efficiency solar cells can be created of freestanding nitride films. Another advantage is that the freestanding GaN is largely transparent to all wavelengths outside of the active region, which provide for higher optical efficiency. In another embodiment of the invention, top layer 10 first consists of an AlGaN buffer providing isolation of the underlying freestanding nitride film 11 from subsequent growths. The flexible, high temperature compatible, single crystal nature of the freestanding nitride film 11 provides an ideal growth substrate for improving subsequent growths of top layer 10 and bottom layer 12 which is not permissible in prior art approaches.

In another embodiment, freestanding nitride film 11 may be still attached to a growth substrate consisting of, but not limited to, sapphire, aluminum nitride, silicon carbide or other growth substrates as known in the art. Structures then may be grown on the exposed nitride surface without affecting the side common to the growth substrate.

The formation of devices via printing and epitaxial growth on either or both top layer 10 and freestanding nitride film 11 including interconnect, devices or micro mechanical structures prior to removal of the growth substrate is an embodiment of this invention.

Both top layer 10 and freestanding nitride film 11 are then removed from the growth substrate using a separation method including but not limited to laser liftoff, chemical means, and/or mechanical means as known in the art. Top layer 10 may consist of metals, ceramics, organics and composite materials. After removal of the growth substrate bottom layer 12 is then deposited via deposition techniques including, but not limited to, MOCVD, HVPE, MBE, CVD, sputtering, evaporative, spincoating, and other deposition techniques as known in the art.

A preferred embodiment of this invention is the epitaxial growth of doped ZnO alloys for top layer 10 and bottom layer 12 on a freestanding nitride film 11 consisting of nitride alloys. Even more preferred is the epitaxial growth of degenerative doped ZnO alloys with dopant concentration greater than $10^{18}$ cm$^{-3}$ and thickness greater than 5000 angstroms. In the case of laser liftoff processes on nitride alloys, the incorporation of excess gallium, indium, aluminum, as well as other elements during the epitaxial growth of the ZnO alloys for bottom layer 12 is facilitated. This eliminates the need for cleaning steps and can be used to enhance the ohmic contact formed between the two layers.

Patterning of freestanding nitride film 11 prior to separation from the growth substrate to form excess gallium, indium, aluminum and as well as other elements to enhance extraction, enhance ohmic contact, or to segment devices on freestanding nitride film 11 is an embodiment of this invention. Utilizing this process it has been demonstrated that a reduction in the forward voltage (Vf) on LEDs can be attained due to improved ohmic contact being formed using a thick epitaxially grown top layer 10 and bottom layer 12 on freestanding nitride film 11. While the complete mechanism of the improvement is unknown, reduced stress and crystal quality of the epitaxially grown bottom layer 12 due to growth on freestanding nitride film 11 is believed to be a major factor in the enhanced performance. The diffusion of excess gallium, aluminum, indium, (but not limited to these elements) created by the laser liftoff and dissociation of the freestanding nitride film 11, during epitaxial growth of bottom layer 12, also contributes to enhanced final device performance. This enhanced performance is not attainable with prior art methods using nitrides on secondary substrates. A preferred embodiment of the freestanding nitride film 11 of substantially gallium nitride alloys where said freestanding nitride film is greater than 10 microns of thickness and preferably less than 120 microns thickness and a surface area greater than 1 mm2, which is utilized in processing. Even more preferred for economical processing is a freestanding nitride film 11 which is a substantially gallium nitride alloy with greater than 30 microns of thickness and less than 80 microns thickness and an area greater than 1 cm$^2$. Also preferred, the area is not greater than 30 cm$^2$ and even more preferably not greater than 10 cm$^2$. This minimizes stresses, bowing, process variations while still allowing a large number of devices to be processed per film.

Freestanding nitride film 11 may be n doped, p doped, semi-insulating, and undoped. Typical dopants include but are not limited to Si, Fe, Mg, and Zn. These dopants may be uniformly, stepwised or gradiently doped. The selection of top layer 10 and/or bottom layer 12 such that their refractive indices are lower or higher than freestanding nitride film 11 to enhance extraction or form a waveguiding structure is an embodiment of this invention.

Alternately, top layer 10 and bottom layer 12 may be formed simultaneously on freestanding nitride film 11. In this case, freestanding nitride film 11 is removed from any growth substrate prior to formation of top layer 10 and bottom layer 12. Layer formation may consist of, but not limited to, dip coating, MOCVD, LPE, CVD, HVPE, sputtering, evaporative, and other coating techniques as known in the art. More preferred is the use of hot wall MOCVD such that a uniform epitaxially grown layer is formed on all surfaces of freestanding nitride film 11. The removal of the overcoated edges via mechanical, chemical, laser, and other etching means to isolate top layer 10 from bottom layer 12 is an embodiment of this invention. More preferred is the partial scribing of the freestanding nitride film 11 via laser scribing. This permits the film to be separated into device chips using a cleaving process, which provides a clean edge to the nitride chip. This eliminates shorting of the devices due to contaminants created during the laser process coating the edges of the chips.

Figure 2B:
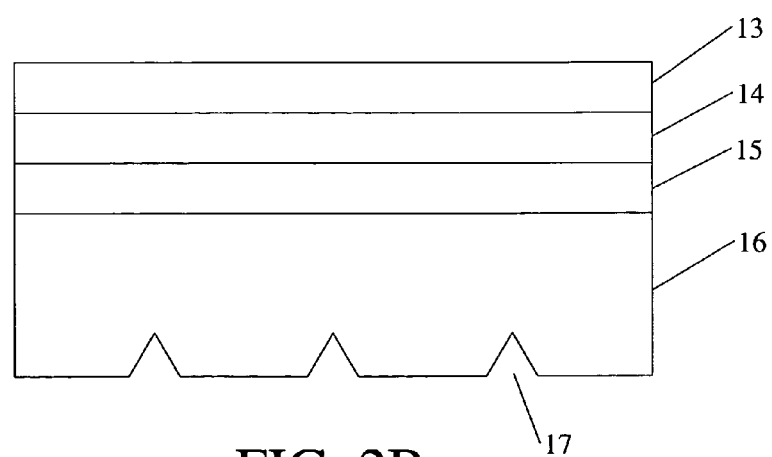
FIG. 2B depicts a process of the present invention to form mechanical structures in the freestanding nitride layers to create extraction elements, optical elements, scribe boundaries, electrical isolation, etc.

FIG. 2B depicts an n-doped freestanding nitride film 16 with at least one active region 15 and p doped layer 14 and top layer 13 on top. At least one active region 15 may include PN junctions, heterojunctions, single and multiple quantum wells, and solar cells. At least one active region 15 and/or p doped layer 14 and/or top layer 13 may be grown prior to or after separation of the growth substrate.

The thickness of n-doped freestanding nitride film 16 enables the formation of features 17. Features 17 can be formed via etching, mechanical means, lithographically, and laser machining processes. The use of scribe lines 17 for enhanced extraction, dicing of the individual die, formation of directive optical elements, formation of optical, thermal, and electrical isolation is an embodiment of this invention. Most preferred is the use of laser machining processes to form features 17. Most preferably, the use of UV diode pumped lasers with an adjustable shaped spot to form features 17. By adjusting the spot shape, direction of scan and spacing a wide range of features can be created. Formation of features 17 can be done after and/or before removal of the growth substrate for the freestanding nitride film 16.

Figure 3A:
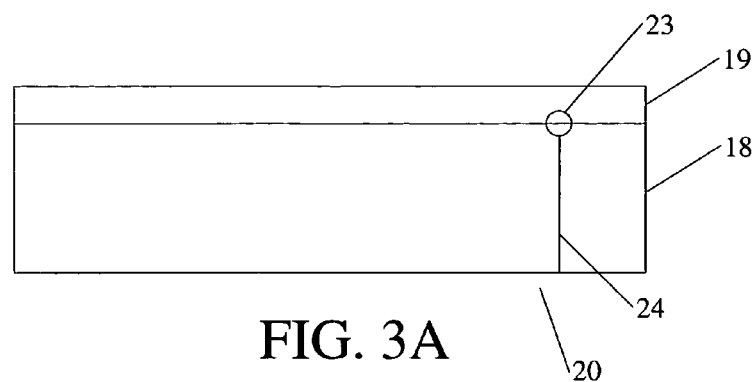
FIG. 3A depicts partial liftoff and other stress relief techniques for separation of thick epitaxial layers from growth substrates of the present invention.

FIG. 3A depicts an epitaxial film 19 grown epitaxially on a growth substrate 18. While a wide range of growth substrates 18 exist, not even native substrates are stress free. The process of making a functional device requires the use of dopants and alloys to create a desired result. As an example, a typical MQW LED structure would consist of Si doped Gallium nitride, with 5 periods of InGaN and GaN layers to define the multiple quantum wells with thickness ranging from 10s to 100s of angstroms, followed by AlGaN barrier a few 100 Angstroms thick, followed by a Mg doped GaN up to a few 1000 Angstroms thick. All these layers induce stresses and can induce bowing of the overall wafer. Therefore what is needed are methods, which mediate the effects of the bowing. These stresses not only can cause bowing but may cause efficiency and spectral performance changes.

It is therefore a preferred embodiment of this invention that the growth substrate 18 be removed with the minimum amount of damage or stress imparted to the epitaxial film 19. As previously disclosed, the use of scanned laser pulses 20 can be used to gently remove an epitaxial film 19 from growth substrate 18. Laser radiation 20 is transmitted through growth substrate 18, which is substantially transparent to laser radiation 20. By selecting the appropriate wavelength and focus, a small localized dissociation 23 of the epitaxial film 19 can be created. In the case of gallium nitride, this typically leads to the formation of gallium metal and nitrogen. The use of a very small pulse preferred line shaped allows the simultaneous formation of extraction elements and/or stress relief surfaces in the epitaxial film 19. Care must be taken to use a sufficiently small enough pulse in relation to the thickness of epitaxial film 19 to prevent cracking.

An embodiment of this invention is the use of DPSS laser with at least one dimension of the spot less than 10 microns. Even more preferable is the use of a line shape which is less than 5 microns in width and greater than 100 microns in length. In the case of thick epitaxial films 19, an alternate embodiment of this invention is the use of scanned laser pulses 22 to pre-scribe the growth substrate 18. Because the sapphire is typically heavily stressed it is possible to induce a stress crack 24 in the growth substrate 18 without fracturing the epitaxial films 19 using this technique. Not only does this stress crack reduce the bowing of the overall wafer, it also allows for improved liftoff because the edges of the wafer are already lifted off.

Unfortunately, as stated earlier, some level of stress is present in any epitaxial film 19, which leads to bowing of both the growth substrate 18 and epitaxial film 19. In the case of thick (greater than 10 microns) epitaxial film 19, bowing is typically between 10 and 100 microns across a 2 inch wafer. Using a variety of techniques, bowing can be adjusted for a given temperature. If there is too much bow at room temperature, separation techniques can lead to cracking of epitaxial film 19. If the bow is too large at growth temperature, it may be difficult to hold the wafer in the reactor.

Figure 3B:
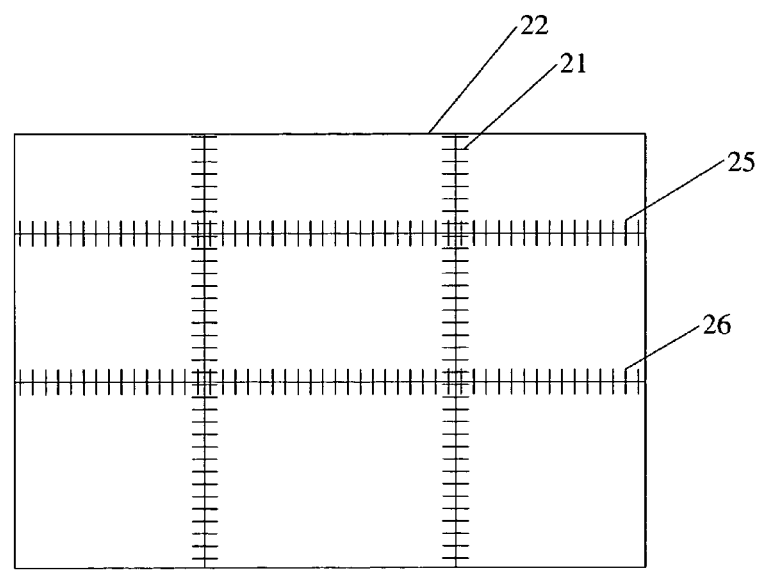
FIG. 3B depicts a plan view of a preferred laser scan pattern process of the invention to liftoff the freestanding GaN from the growth substrate.

The use of this temperature dependent bowing effect to adjust the growth conditions of devices on epitaxial film 19 is included as an embodiment of this invention. In general, methods are required to deal with the stress created during epitaxial growth of thick epitaxial film 19 on any growth substrate 18. As epitaxial film 19 thickness increases, epitaxial film 19 begins to behave more and more like a bulk material. Epitaxial films 19 of gallium nitride with thicknesses approaching 100 microns typically exhibit bows in excess of several hundred microns on a two inch sapphire wafer at room temperature. A preferred method for the removal of epitaxial film 19 from growth substrate 18 is the use of at least one vertical scanned line 22 and at least one horizontal scanned line 25 to define isolated regions within a wafer as shown in FIG. 3B. By pre-lifting regions of the epitaxial film 19, higher yields can be realized in subsequent separation. The formation of stress crack 24 and or scribing 21 and 26 of nitride film 19 or growth substrate 18 to further reduced stress and allow for larger pieces of freestanding epitaxial layer 19 is disclosed.

FIG. 4 depicts a process for removal of thick epitaxial film 28 from a growth substrate 29. In thick epitaxial films 28, significant backside deposition and edge growth can occur as depicted in FIG. 4A. This leads to very high stresses on the outer perimeter of the overall wafer.

Figure 4A:
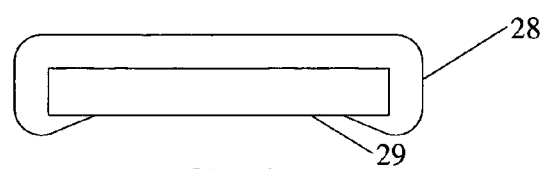
FIG. 4A depicts backside deposition during growth of the epitaxial layer of the present invention.
Figure 4B:
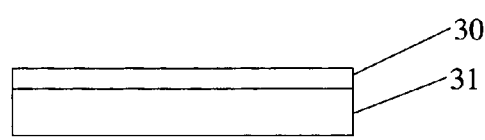
FIG. 4B shows the epitaxial layer after cleaning the backside and edges of the overgrowth.

FIG. 4B depicts a thick epitaxial film 30 on a growth substrate 31. Removal of backside deposition and/or edge growth may be through, but not limited to, mechanical means, masking during growth process, laser scribing and break, and chemical etching means. By removing the outer edge growth and backside deposition, improved yield in subsequent processing steps can be realized.

Figure 4C:
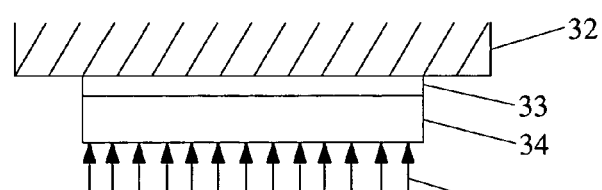
FIG. 4C shows the use of a special platen to reduce bow during laser liftoff processing.

In FIG. 4C, heating element 32 may optionally be used to reduce bow of layers 33 and 34 for the laser liftoff process or partial laser liftoff processes described previously. The use of a flexible heating element 32 is a preferred embodiment. Using the properly designed template formed from layer 33 and 34 and the proper temperature of flexible heating element 32 it is possible to reduce the bow during liftoff and increase yield. Alternately, irradiation, heated air and other means may be used to heat layer 33 and 34. A temperature range of ambient to 500° C. may be used. More preferably a temperature range of 100° C. to 300° C. may be used. In addition, use of heating element 32 to flatten the bow such that a more uniform laser focus plane is created and liftoff or scribing can be accomplished without cracking the wafer may also be utilized. Laser radiation 35 may consist of, but not limited to, a circular spot, line source, or a pattern that is scanned via movement of the wafer via stages or via movement of the beam via a galvo or other optical stage. Since the laser process is additive the use of randomized or multiple scans to create a given amount of liftoff in a particular region, is also disclosed. Even more preferred is the use of a line source with a width dimension less the 5 microns and a length greater than 100 microns. The narrowness of the line source is critical to prevent cracking of layer 33. In all these applications the nitride layer 33 must be substantially crack free and exhibit a thickness greater than the width dimension of the line source to allow for reasonable yield. Layer 33 may consist of polar, non-polar, semi-polar, semi-insulating, doped, undoped and layered nitrides. In particular, a preferred embodiment is layer 33 consisting of tens of microns of undoped or doped GaN with a few microns of semi-insulating or insulating GaN or nitride alloy as a growth substrate for FET and other electronic devices, which require an isolated base. The use of these semi-insulated or insulated freestanding nitride films in forming power and RF devices for communications and hybrid vehicles is also an embodiment of this invention.

Figure 4D:
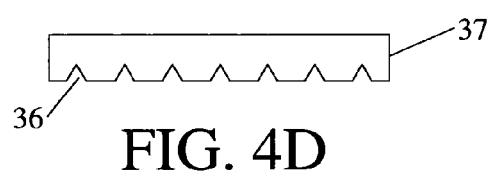
FIG. 4D shows the lifted off freestanding nitride layer with patterned structures.

FIG. 4D depicts a freestanding epitaxial film 37 and patterning step 36 on said freestanding epitaxial film 37. In the case of thick freestanding epitaxial films 37, areas greater than 1 cm2 can be created which can be handled and processed without the need for a growth substrate described above. The removal of the growth substrate described above allows for access to both sides of the freestanding epitaxial film 37. Preferred are freestanding epitaxial films 37 with thickness greater than 10 microns. More preferred are freestanding epitaxial films 37 with thickness greater than 30 microns due to increase handlability and crystal quality. Also preferred are freestanding epitaxial films 37, which are less than 200 microns due to better thermal performance and cost. Patterning step 36 may be subtractive or additive.

The use of high temperature processing up to the decomposition temperature of the freestanding epitaxial film 37 is disclosed. The use of ammonia and inert and/or vacuum atmospheres for processing is also disclosed especially for processes with temperature greater than 500° C. The use of laser scribing and feature forming for patterning step 36 is a preferred embodiment of this invention. In particular, the partial scribing through the wafer to allow for subsequent segmentation is disclosed.

Figure 4E:
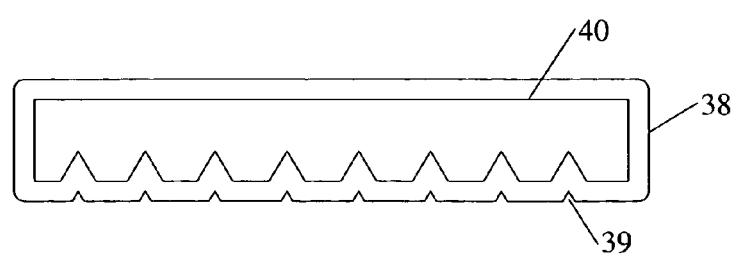
FIG. 4E shows the patterned freestanding epitaxial film with overcoating.

FIG. 4E depicts the use of coating means 38 over patterned epitaxial film 40. As disclosed previously, epitaxial growths on one or both sides of patterned epitaxial film 40 is preferred. Alternately, coating means 38 may include, but not limited to, amorphous growth, polycrystalline growths, dip coatings of organic and inorganic media. A preferred embodiment for coating means 38 is epitaxial growth on one or both sides of patterned epitaxial film 40 of a transparent conductors including, but not limited to, doped ZnO alloys, doped nitride alloys, as well as other materials known in the art. ZnO alloys and nitride alloys are a preferred embodiment due to high thermal conductive, low absorption, and ability to grown high quality crystalline layers.

The incorporation of luminescent elements in the form of ions including, but not limited to, Bi, Eu, Er, Dy, Pr, Li, Ho, Ce and other rare earths to the freestanding nitride structure is also an embodiment of this invention. The formation of thick layers of these luminescent elements to allow for sufficient absorption and reemission is preferred. The formation of the luminescent layers on one or both sides may also be part of the structure. Even more preferred is the use of two different coating means 38 on either side of patterned epitaxial film 40. In this manner a wide range of the colors can be generated combining the emission spectrum of an LED in patterned epitaxial film 40 with the emission spectrum of the two different coating means 38 excited by the emission spectrum of an LED in patterned epitaxial film 40. Alternately, different absorption spectrum to two different coating mean 38 can be added for solar applications. Even more preferred is a luminescent layer which converts the radiation of one wavelength to another wavelength for a coating means 38 on a patterned epitaxial film 40 and an absorbing layer for a separate coating means 38 which allows more efficient energy conversion.

Also included is the use of patterned epitaxial film 40 as a growth substrate for luminescent layers for coating means 38. This may be done using but not limited to MBE, MOCVD, HVPE, sputtering, evaporation, dip coating, spin coating, and/or LPE. The use of coating means 38 which are composites containing luminescent materials either in powder, quantum dots, or other luminescent means is disclosed. Coating means 38 may or may not fill in feature 39 formed by the patterning step disclosed earlier. In this manner, efficient extraction elements can be formed.

Alternately, series resistance can be reduced and Vf can be reduced by using coating means 38 to allow conductive layers to be embedded into patterned epitaxial films 40. The resulting 3 dimensional partial via can used to control current spreading by varying the density of features and depth of features.

Figure 4F:
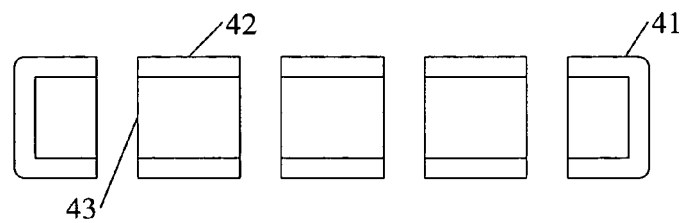
FIG. 4F shows the epitaxial film separated into individual die.

FIG. 4F depicts the segmentation of epitaxial die 43 with coating means 42. The use of breaking means including, but not limited to, mechanical pressure, ultrasonics, and chemical means is disclosed. Edge die 41 may be discarded or further processed to isolate the devices. Alternately, mechanical or chemical means may be used to remove coating means 42 along the edges. In either case this process can be used to create but not limited to solar cells, LEDs; EELEDs, Laser diodes, power devices, RF devices and MEMS.

Figure 5A:
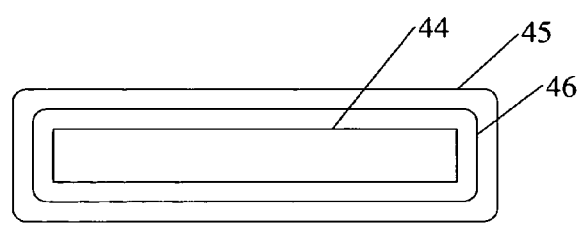
FIG. 5A depicts a dual sided epitaxial solar cell of the present invention.

FIG. 5A depicts a solar cell. A freestanding epitaxial film 44 of the present invention is coated with an absorptive layer 45 and an outer contact layer 46. The freestanding epitaxial film 44 may consist of, but is not limited to, alloys of nitrides and oxides. More preferably, freestanding epitaxial film 44 is a nitride alloy or zinc oxide alloy.

Absorptive layer 45 is grown on at least one side of freestanding epitaxial film 44. The function of absorptive layer 45 is to absorb and convert incident radiation into solar energy while freestanding epitaxial film 44 and outer contact layer allow for extraction of this energy from the device as known in the art. More preferably, absorptive layer 55 is a nitride or oxide alloy with a band edge within the visible spectrum. The formation of multiple layers and/or photonic structures within absorptive layer 55 is to enhance conversion efficiency, to modify the absorption spectrum and/or to enhance electrical properties of die device.

Outer contact layer 46 may be, but is not limited to, a nitride or oxide alloy. More preferably, outer contact layer 46 is substantially transparent to radiation to be absorbed by absorptive layer 55. Even more preferably, outer contact layer 46 is the opposite conductivity type semiconductor material to freestanding epitaxial film 44 such that a solar cell is formed. Most preferred is that freestanding epitaxial film 44 is a n type nitride alloy and outer contact layer 46 is a p type nitride or oxide alloy.

The addition of current extracting elements including, but not limited to, metal traces, thick film conductors, degenerative semiconductors to the outer surface of contact layer 46 is disclosed. The formation of surface texturing on any of the layers disclosed to enhance absorption including photonic crystal structures as known in the art is an embodiment of this invention.

Figure 5B:
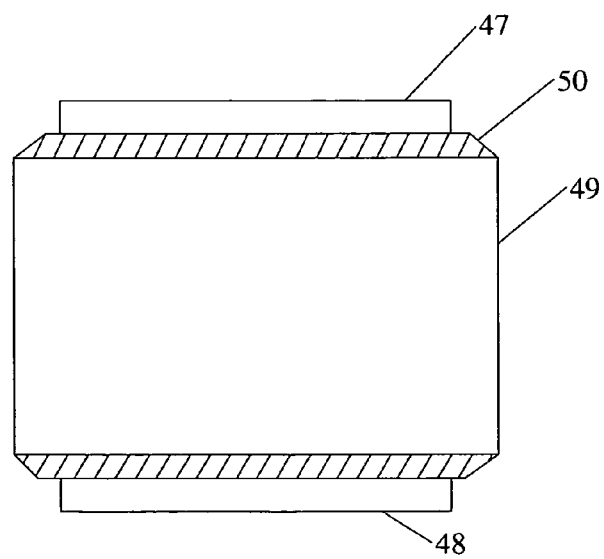
FIG. 5B shows a side view of a solar cell using the invention.

FIG. 5B depicts a possible side view of the solar cell depicted in FIG. 5A. In this particular embodiment, freestanding epitaxial film 44 extends past absorptive layer 45 and outer contact layer 46 to expose contacts 47 and 48. Isolation of contacts 47 and 48 from solar cell body 49 can be created by, but is not limited to, etching, laser ablation, chemical means and/or mechanical means. The addition of a passivation layer 50 is also disclosed. This passivation layer protects the various semiconductor layers from being shorted out by various environmental factors. The use of thick film and thin film metallization on contacts 47 and 48 and at least partially over solar cell body 49 to facilitate and/or enhance current extraction and/or subsequent interconnect is also disclosed. Alternately, the device construction disclosed in FIG. 5 can also be used to create a dual side LED structure, EELED, RF device and power device by replacing absorptive layer 45 with an appropriate light emitting and/or semiconducting active region.

FIG. 6 depicts an LED with an embedded contact spatially patterned to enhance current spreading. Even though the authors have disclosed the use of degenerate epitaxially grown transparent conductors, there still can exist current spreading limitation especially at high current density in large area die.

Figure 6A:
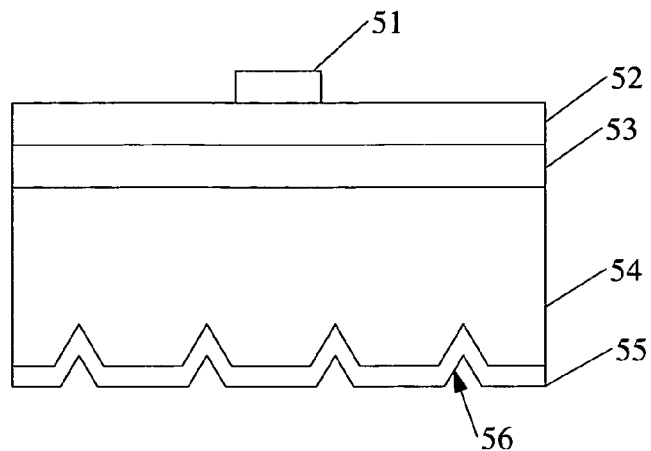
FIG. 6A depicts a vertical LED fabricated using the methods of the invention.

In FIG. 6A, top contact 51 forms an ohmic contact to contact layer 52, which then is electrically in contact to active region 53, which then in turn is in contact with contact layer 54. In the case of a vertical LED, contact layer 52 and 54 can be opposite conductivity semiconductor types. More preferably, contact layer 52 and 54 are nitride and/or oxide alloys. Based on the use of thick contact layers 52 and 54, it becomes possible to modify the resistive nature of the layer using features 56. As an example, Si doped Gallium nitride typically has a resistivity of approximately 0.05 ohm-cm while degeneratively doped ZnO has a resistivity of less than 0.0005 ohm-cm. If features 56 are cut through a substantial portion of contact layer 54, conductor 55 can be used to locally lower the resistivity. Conductor 55 can consist of any material with a lower resistivity than the associated contact layer being modified by features 56. The 3-dimensional resistivity of both p and/or n type semiconductors can be modified using this technique. Features 56 can be formed using etching, ablation and mechanical means as known in the art. Most preferred is the formation of features 56 by laser patterning either during liftoff and/or after liftoff from the growth substrate.

Figure 6B:
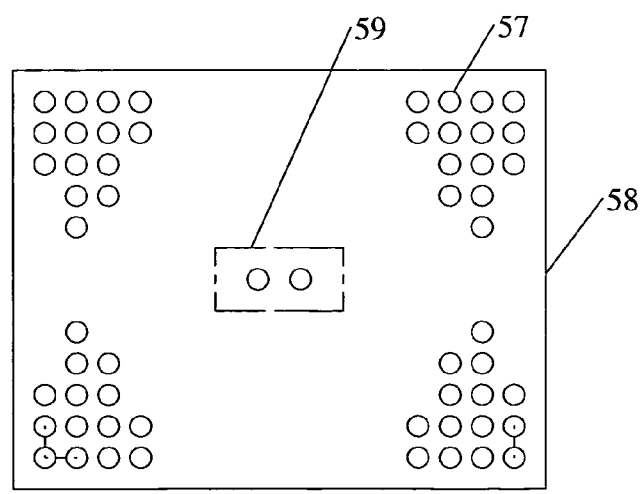
FIG. 6B shows how spatially varied features can improve current spreading of the high brightness LEDs.

FIG. 6B depicts a spatially varying pattern of features 57 within LED 58 that compensates for current crowding caused by the top contact 59. In addition to compensating for current spreading, the features 57 can also be used to enhance extraction efficiency. The use of metal contacts instead of transparent conductive oxides is also disclosed. Most preferred is the use of low resistivity layer for conductor 55 that fills or conforms to the features 57 such that overall device efficiency is improved. Even more preferable is the use of epitaxial growth to form conductor 55 such that excess elements formed during laser patterning of features 57 diffuse into conductor 55 thereby reducing absorption losses and enhancing ohmic contacts.

FIG. 7 depicts stacked LEDs with enhanced current spreading and/or uniform drive conditions. By combining LEDs with different output spectrums and stacking them, broadband emitters are created.

Figure 7A:
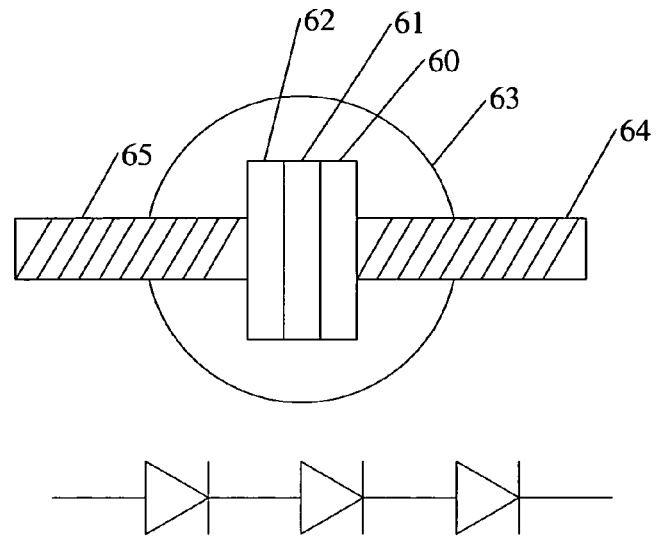
FIG. 7A depicts a means of making a broadband light source using stacked freestanding LEDs of the present invention.

FIG. 7A depicts three freestanding LEDs 60, 61, and 62. In this particular example, degenerative highly doped ZnO is used to allow for contact between the three freestanding LEDs 60, 61, and 62. The use of conductive epoxy, thick film conductors and other metal bearing contact methods to enhance interconnect between the three freestanding LEDs 60, 61 and 62 is an embodiment of this invention.

Contacts 64 and 65 provide for the injection of current into the device while outer envelope 63 index matches, provides an environmental seal, and mechanically holds the assembly together. Unique with this invention is the ability to use low temperature glasses to form outer envelope 63 because of the high temperature nature of freestanding LEDs 60, 61, and 62. The number of devices and electrical connection of the devices may be varied to produce a desired light source. While three LEDs are depicted, the use of more or less LEDs ranging from 1 up is disclosed. The use of anti-parallel, series, parallel and combinations of anti-parallel, series, and parallel is also disclosed. The use of more than two contacts 64 and 65 to facilitate AC, sequential, and/or tuneable control of the LEDs is also disclosed.

The inclusion of luminescent elements between and/or external to freestanding LEDs 60, 61, and 62 may also be used. The inclusion of luminescent elements within and/or on the outer surface of outer envelope 64 may also be incorporated. The use of luminescent elements and/or LEDs with different emission wavelength and combinations are all possible with this invention.

Figure 7B:
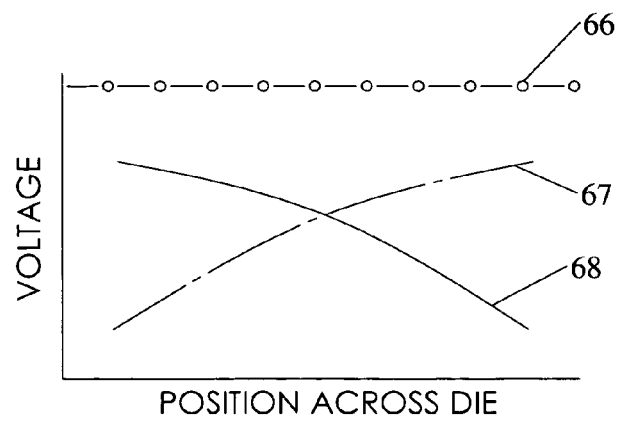
FIG. 7B shows how to use the present invention to create LEDs or solar cells with variable wavelength sensitivity on the same die.

FIG. 7B depicts voltage variation across an LED based on non-uniform growth conditions for two stacked LEDs. With this invention and freestanding nitride films, it is possible to create LEDs and solar cells that have variable wavelength responses even within a given die. By stacking freestanding LEDs 60, 61, and 62, many non-uniformities can be balanced out. The resulting volume emitter in the case of LEDs, volume absorber in the case of solar cells, volume diode in the case of stacked diodes, and/or volume modulator in the case of a RF device is to enhance uniformity and increase device performance levels. In the case of a volume emitter created by stacked LEDs, if absorption losses are low as in this case, the flux per etendue 67 can be increased and the current spreading losses 68 can be reduced. In the case of a volume absorber, current extraction 67 can be increased and the absorption cross-section 67 can be increased.

The use of reflectors and other recycling means to further enhance radiance or absorption are included as embodiments as well. For power devices, stand-off voltage, peak voltage and current uniformity based on volume diodes can be enhanced. For RF devices the use of stacked devices can greatly reduce inductance and capacitance effects. In FIG. 7B two non-uniform LEDs, which have varying turn on voltages are used to compensate for the other such that a uniform turn on voltage 66 is created across the device. Since these die also have different emission wavelengths across each die broadband emitters can be formed.

Figure 8A:
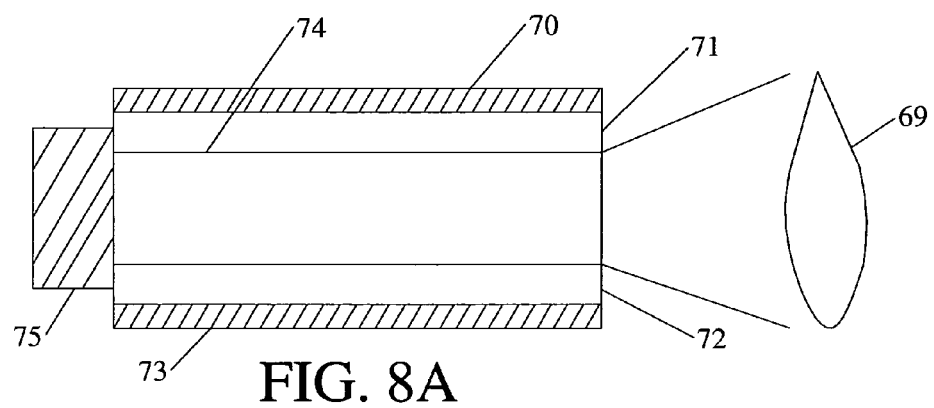
FIG. 8A depicts an EELED formed using freestanding films and dual sided processing of the present invention.

This invention using thin freestanding nitride films permit elegant means to form high efficiency devices. For example, FIG. 8A depicts an EELED based on dual sided processing. Active region 74 for emission of light may consist of gain media and/or and active emitter. Cladding contacts 71 and 72 provide electrical contact to the active region but also exhibit a lower refractive index such that a waveguide is formed. Top contact 70 and bottom contact 73 provide for electrical input and output to the device. A reflective mirror 75 is positioned such that light emitted within the active region is coupled back into the active region and re-emitted as output 69. The device is a side emitting LED.

Figure 8B:
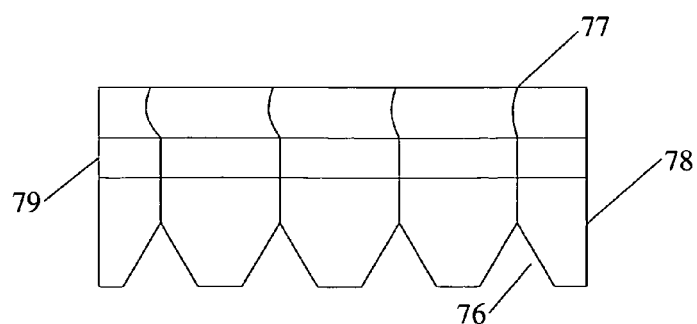
FIG. 8B shows how to fabricate partial mirrors for EELEDs, Lasers, etc with the present invention.

FIG. 8B depicts the use of scribing lines 76 cut in freestanding film 78 containing a gain media and/or active region 79 such that scribing lines 76 align to cleavage planes within freestanding film 78. As such individual devices can be later cleaved as depicted by cleave lines 77 forming a partial mirror for EELEDs, laser diodes, and other gain based devices.

Figure 9A:
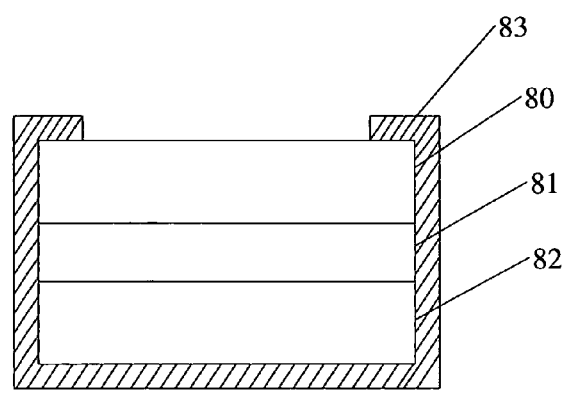
FIG. 9A depicts restriction of output of stacked volume emitter of the present invention.

FIG. 9 depicts a volume emitter utilizing the freestanding nitride film of this invention with a restriction in output. FIG. 9A depicts a volume emitter consisting of a stack of freestanding LEDS 80, 81, and 82. Alternately, this stack could also contain at least one luminescent element as previously disclosed. In either case, a volume of emission is contained or restricted in some manner such that some portion of the emitted light is recycled back through the origin of the emission. As previously stated recycling can be done via restriction in emission area, restriction of angular output, restriction of polarization and restriction of wavelength. In FIG. 9A reflector 83 restricts the emission area 84. Enhancement of radiance based on restricting the emission area 84 such that the emission area 84 is less than the area of one of the freestanding LEDS 80, 81 and 82.

Figure 9B:
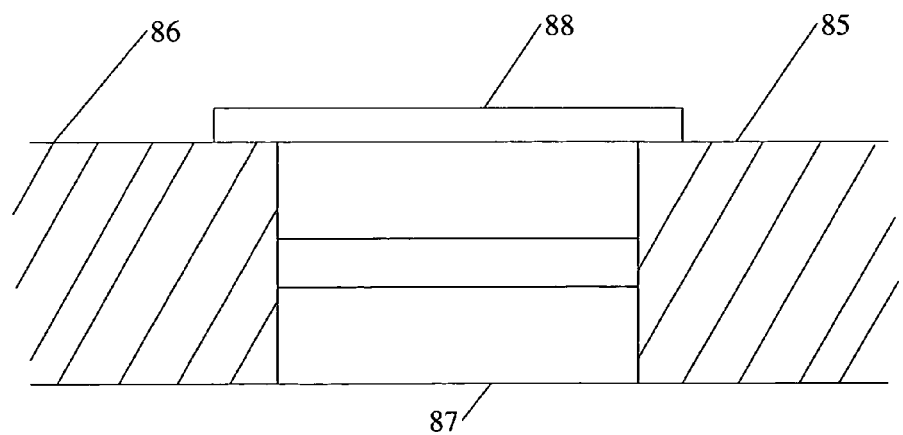
FIG. 9B shows a volume emitter fabricated with the present invention with a recycling cavity and optical element on the output.

FIG. 9B depicts a volume emitter utilizing the freestanding nitride film of this invention with a combination of area restriction created by contacts 85 and 86 and/or an angular restriction 87 and 88 including but not limited to BEF, microoptical elements, diffractive elements, photonic crystals, reflective polarizers, and dichroics such that a portion of the emitted light from at least one of the emitters within the volume emitter recycles back to the original source of emission.

Figure 10A:
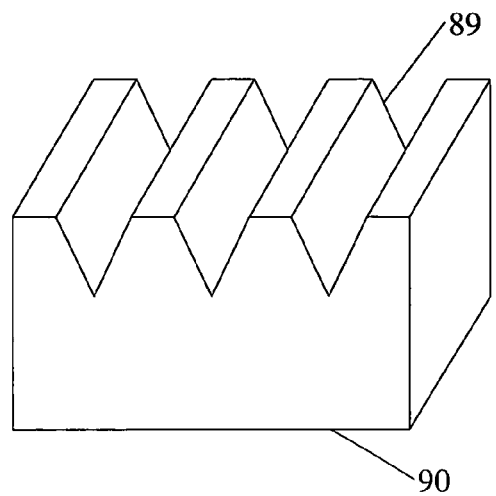
FIG. 10A depicts at least one linear emitter containing an addressing means of the present invention.

FIG. 10A depicts an LED display based on at least one epitaxial linear source 90 with addressing means. Using the techniques described above linear arrays of LEDS can be formed which can be individually addressed using a simple interconnect. Features 89 can be used to isolate electrically and/or optically the individual elements.

Figure 10B:
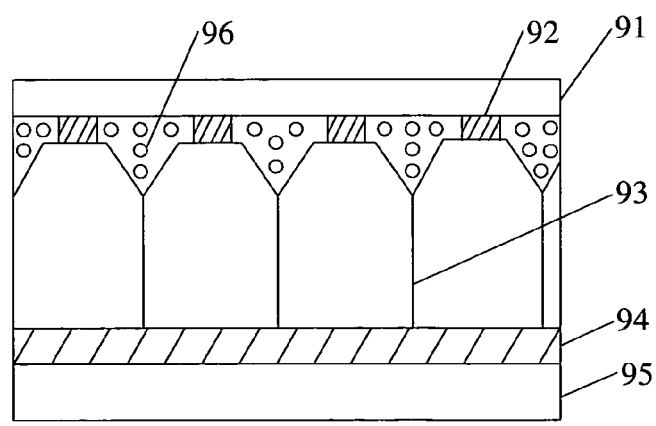
FIG. 10B shows interconnect means to linear display.

FIG. 10B depicts the use of interconnect films 91 and 95 and contacts 92 and 94 to electrically interconnect the linear array elements. Adhesive layer 96 can be used to electrically and/or optically isolate the individual elements. Features can be used to cause cleavage at cleave lines 93 after assembly. This enables enhanced optical isolation of the individual elements. The stacking of these linear arrays to form area arrays, which are addressable, are also an embodiment of this invention.

Figure 11:
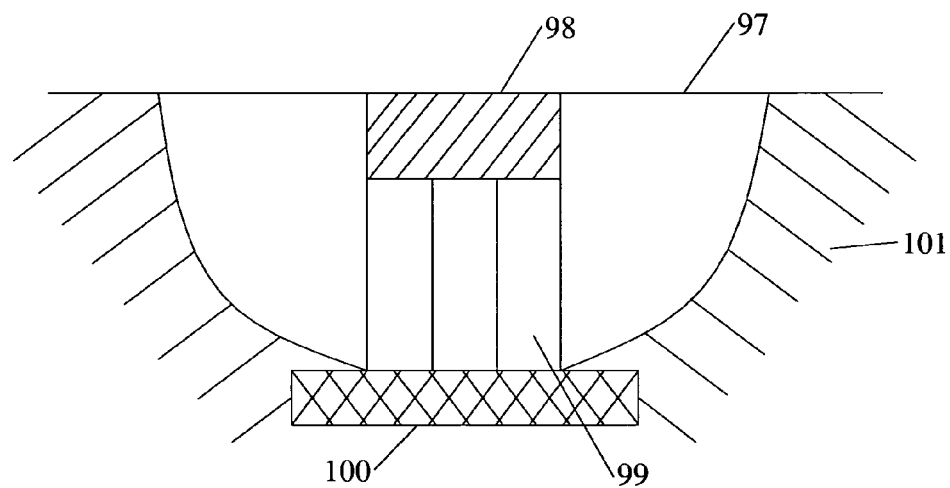
FIG. 11 depicts a volume emitter combined with at least one solid luminescent emitter of the present invention.

FIG. 11 depicts a white light source based on stacked epitaxial chips formed by the methods of this invention to form volume emitters and solid luminescent elements. The ability to form volume emitters can lead to much higher flux density than simple area emitters. The use of solid luminescent elements are required to prevent not only degradation effects but also thermal quenching effects. A number of ceramic, single crystalline, polycrystalline and composite luminescent materials have been developed. The use of these materials with volume emitters 99 is an embodiment of this invention. More preferred is the use of at least one electrically conductive luminescent element 97 for the ejection and/or extraction of current into the volume emitter 99.

Alternatively, the shaping luminescent element 97, whether electrically conductive or not, and its use with a volume emitter is an embodiment of this invention. A preferred embodiment is the use of nitride and/or electrically conductive oxides, in particular zinc oxide alloys as luminescent element 97.

Alternately, element 98 may consist of but not limited to reflective element, output sensor, additional luminescent element, cooling means, absorber, and/or gain media being pumped by volume emitter. An additional bottom reflector 100 is disclosed to optically restrict light output from volume emitter 99 and/or provide a thermal conduction path to heatsink 101.

Figure 12:
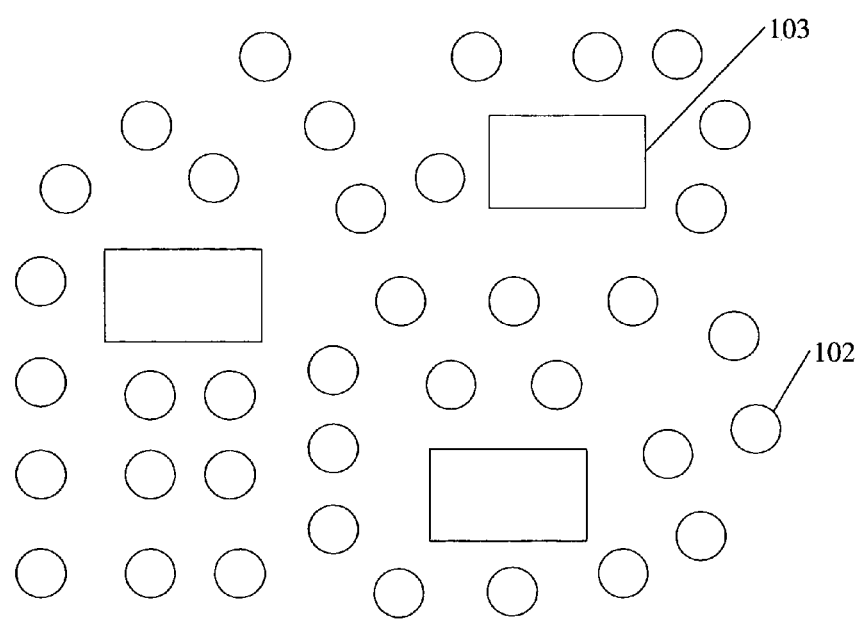
FIG. 12 depicts a LED powder of the present invention.

FIG. 12 depicts an LED powder containing at least one glass frit. The freestanding LEDs 103 can be processed at atmospheric temperatures greater than 700 degrees C. due to their intrinsic properties. The LED emitting layers may be formed by the methods previously disclosed herein. They can be processed at higher temperature using controlled atmosphere such as, but not limited to, vacuum, inert, and ammonia. These high processing temperatures enable the use of brazing, frits, glasses, conductive thick films, and glazes typically not permissible with conventional LEDs. In addition, the ability to form a vertical structure with sufficient thickness and mechanical integrity to be handled enable the formation of composites as depicted in FIG. 12.

Freestanding LED 103 is dispersed within a matrix 102 which may consist of, but is not limited to, low temperature glasses, organic binders, photo imaging matrixes, liquids and other thick film materials. The resulting material may be subsequently processed via spin coating, dipping, printing, ink jet dispensing, spraying, tampo, transfer tapes, doctor blading, and other thick films processing techniques as known in the art. The use of this LED powder in liquid, powder, solid and gaseous transport processes is also disclosed. A preferred embodiment is that the freestanding LEDs are thicker than the largest sized matrix 102 particle.

Alternately the matrix 102 may be a film to which the freestanding LEDs 103 are temporarily mounted. Upon melting of the matrix 102, the freestanding LEDs 103 are embedded within said matrix 102. The addition of luminescent elements within the matrix 102 and/or attached to freestanding LEDs 103 is also disclosed. These luminescent elements may consist of, but are not limited to, quantum dots, powders, ceramics, composites, glasses, and single crystal elements. The freestanding LEDs 103 preferably are greater than 10 microns thick and have an area to thickness ratio greater than 1. The glass matrix 102 preferably has a melt point greater than 300 C and provides an environmental seal to protect the freestanding LEDs 103.

Figure 13:
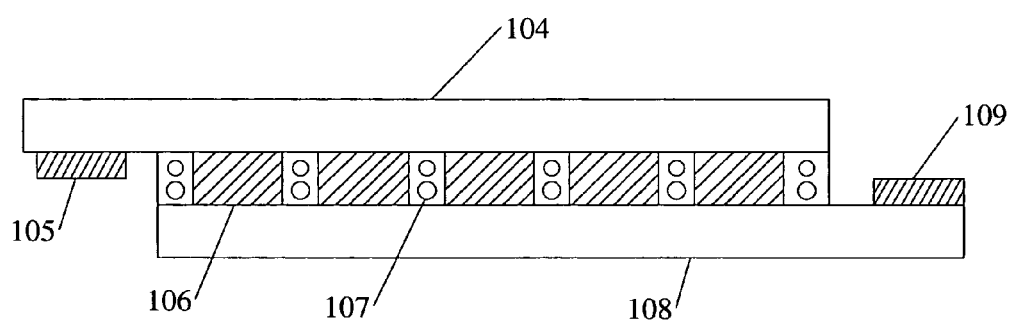
FIG. 13 depicts a light source using LED powder of the present invention.

FIG. 13 depicts a method of forming a light source using an LED powder. The LED powder described above is sandwiched between top contact 104 and bottom contact 108. Additionally, external contacts 109 and 105 may be added to allow for additional levels of interconnect including but not limited to soldering, brazing, welding, and mechanical contacts. Freestanding LEDS 106 act as spacers between top contact 104 and bottom contact 108. Preferably, at least one of top contact 104 and for bottom contact 108 contains at least one transparent conductive layers through which current can to delivered to the freestanding LEDs 106. In the case of non LED devices, the use of opaque and/or metal top contact 104 and bottom contact 108 is also disclosed. The use of volume emitters, which have been pre-assembled either using wafer bonding techniques or other bonds means is also disclosed. The matrix 107 may include but not limited to, thermoplastics, thermosets, low temperature glasses, epoxies, luminescent elements, directive elements, high temperature glass spacers, and composites. Most preferably, the matrix 107 consists of a glass frit with a melting temperature below the decomposition temperature of the freestanding LEDs 106. The application of pressure, vibration, ultrasonics, heat, and radiation to melt and/or otherwise cure the matrix 107, such that a sealed assembly is formed containing freestanding LEDs 106, electrically connected together is disclosed. In the case of non-LED applications, the use of this approach to form hermetically sealed arrays of devices is also disclosed.

Figure 14A:
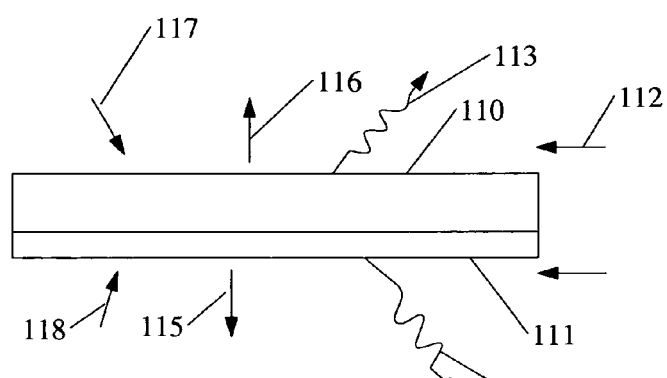
FIG. 14A depicts temperature control of freestanding nitride films during processing.
Figure 14B:
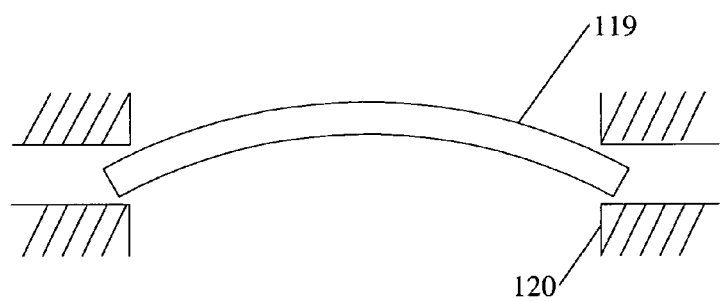
FIG. 14B depicts means of capturing freestanding nitride films to achieve dual sided processing.

In the following we show a method to process the freestanding nitride films and perform dual sided processing. FIG. 14A depicts a freestanding nitride film 110 with an optional absorbing layer 111 and various cooling and heating means. Typically a susceptor or platen is used to heat and cool nitride based devices. This however leads to large thermal time constants due to thermal inertia. Freestanding nitride film 110 however has a very low thermal mass and is substantially homogenous, as such much faster thermal ramps can be employed in the fabrication of devices using freestanding nitride films 110 than templates, non-native substrates or even bulk nitride wafers. Freestanding nitride film 110 and optionally absorbing layer 111 have a temperature determined by the balance of input energy 117 and 118, convective cooling 116 and 115, and radiative cooling 113 and 114. Convective cooling 116 and 115 are influenced strongly by convective flow 112 within the reactor or deposition equipment. By minimizing the thermal mass of freestanding nitride film 110 and optionally absorbing layer 111 it possible to dramatically decrease growth times which can not only lead to lower manufacturing costs, but better performance devices by improved epitaxial layer definitions. Both single sided and dual sided definitions are disclosed. FIG. 14B depicts a mounting configuration in which support means 120 have a minimum impact on the thermal time constant of the freestanding nitride film 119 and also enable dual sided growth. In general, support means 120 hold the outer upper and lower surface edges of the nitride film. The support means do not substantially increase the thermal time constant of the freestanding nitride film 119 is a preferred embodiment of this invention. Freestanding nitride film 119 with a thickness less than 100 microns is preferred due to the relationship $\tau=\rho c_p V/hA_s$ which defines the convective thermal time constant $\tau$ of a surface. As can be seen by the equation for simple films, the ratio $V/A_s$ has a strong influence on the time constant of freestanding nitride film 119 and is essentially equal to the thickness of the film. The $\tau$ thickness should be minimized, the convective thermal coefficient h should be maximized and the $\rho c_p$ should be minimized. The convective thermal coefficient h is tied to reactor growth conditions to some extent and is limited to under 100 W/m2K for most gas based systems. By using a freestanding nitride film $\rho c_p$ is minimized compared to conventional processes using thick sapphire, silicon, and/or SiC substrates. Therefore a preferred embodiment of this invention is the use of freestanding nitride film 119 with a convective thermal time constant less than 3 seconds.

Figure 15A:
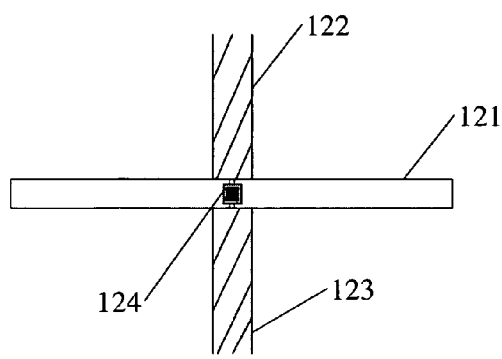
FIG. 15A depicts a low thermal inertia mounting.

FIG. 15A depicts an alternate low thermal mass mounting for a freestanding nitride film 121. In this configuration a hole is cut in freestanding nitride film 121 such that a pin or wire 124 may be used to support the freestanding nitride film 121. Optionally, additional support means 122 and 123 can be used to provide additional support to the freestanding nitride film 121. Or optionally posts 122 and 123 may be used without the hole in the film to support it by pinching.

Figure 15B:
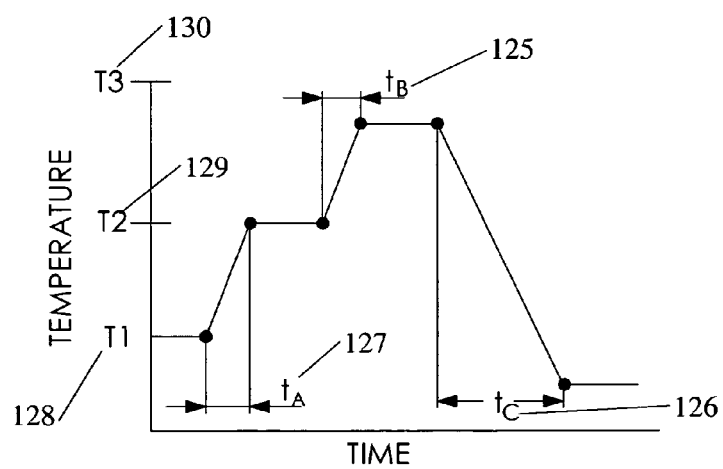
FIG. 15B shows process temperature ramps.

FIG. 15B depicts a typical InGaN quantum well growth cycle. Because composition is strongly dependent on growth temperature, the temperature of the freestanding nitride film determines the composition determines the composition to a great extent. As an example, a typical quantum well might contain 30 Angstoms of $In_{0.03}Ga_{0.07}N$ and 120 Angstroms of GaN with a typical growth rate of 0.1 microns/hour. To grow the quantum well, the freestanding nitride film will be ramped form starting temperature 128 to InGaN growth temperature 129 which may be around 750° C. Depending on the previous parts of the structure the starting temperature 128 can be between ambient and 1200° C. In any case there is the transition time between these two temperatures, which is ramp time 127. Similarly ramp times 125 and 126 define the time it takes to change the temperature of freestanding nitride film within the reactor. GaN temperature 130 will be typically 1000° C. As such in order for the ramp times 127, 125, and 126 to not represent a significant percentage of the growth time very low growth rates must be used to ensure at least the majority of the 30 angstroms and 120 angstroms layer are being grown using the right composition. In commercial reactors utilizing large wafers, growth rates less than 0.1 microns/hour are required simply to approximate the desired composition and layer thickness. By utilizing small, thin freestanding nitride films of this invention the thermal time constants of the reactor system ramp and process times can be minimized leading to more clearly defined structures within the epitaxial layers. If 0.1 microns/hour is used for a 30 Angstrom quantum well the total growth time for the InGaN layer is approximately 100 seconds. By decreasing the thermal mass of the growth substrate as described above, enabling cooling and heating from both sides of the substrate, and minimizing the thermal mass of the supporting structures holding the growth substrate ramp times can be reduced which in turn enables higher growth rates which decrease manufacturing costs as well. Lastly, the use of a substantially homogenous freestanding nitride film also is an important attribute of this invention because it enables reduction of ramp times without cracking of the growth substrate. Template and non-native growth substrates are especially susceptible to this problem due to higher built in stresses. A preferred embodiment of this invention is the use of freestanding nitride films, support structures, and heating/cooling means, which enable ramp rates greater than 250 C/sec during growth. In this manner higher growth rates and/or better interface definition can be realized than conventional template, non-native and bulk wafer approaches.

Figure 16:
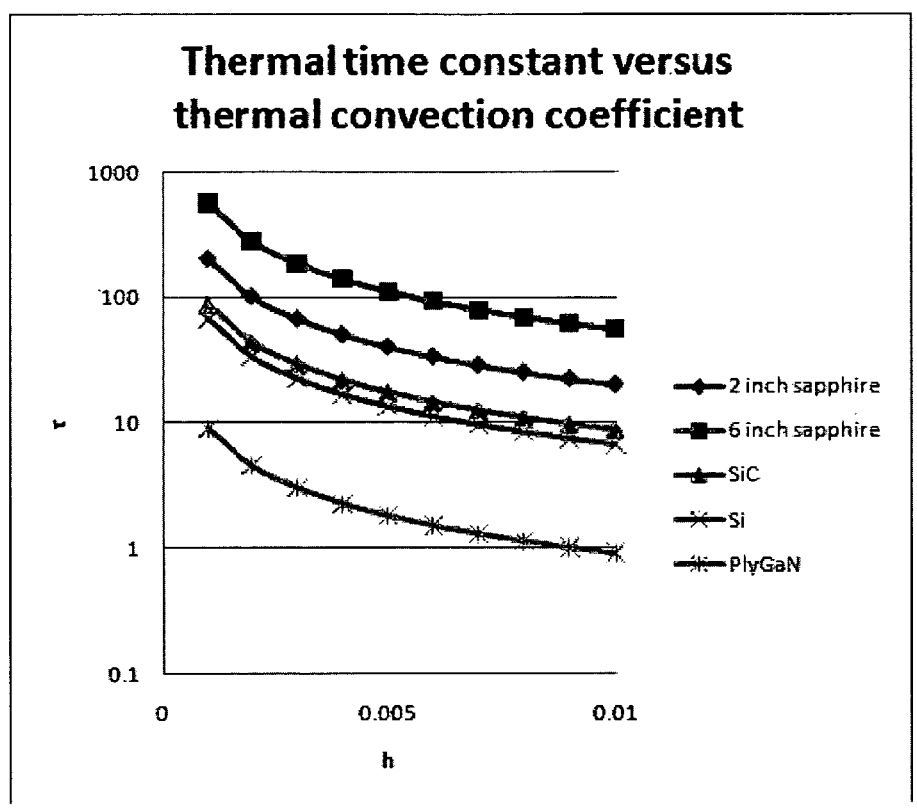
FIG. 16 graphs thermal time constant t of various substrates as a function of h.

FIG. 16 compares the thermal time constant of various substrates. The thermal time constant to a great extent determines how quickly the growth conditions within the reactor can be changed. While the exact number requires extensive modeling, FIG. 14 illustrates how the thin nature of freestanding nitride foils can have a dramatic impact on growth conditions. In the case of MQW growth layer thicknesses vary from tens to hundreds of Angstroms. This mandates that either very slow growth rates are used or very rapid changes in reactor growth conditions are required. In conventional large platen reactors the thermal mass of the substrates and associated platens limit how rapidly the temperature can be changed. As such typical growth times of 10 minutes per QW are used. Freestanding nitride films or foils can reduce thermal time constants by more than 10×, which then allows for much faster QW growths. This reduces the overall manufacturing time significantly. In addition, very rapid thermal ramps are enabled by freestanding nitride foils, which can be used to more precisely control the interfaces between various layers. As an example, a single QW consisting of 30 Angstroms of InGaN and 120 Angstroms of GaN at an average growth rate of 0.1 microns/hour (0.3 Angstroms per second) would take 108 seconds to grow the 30 Angstrom layer. At 1.0 microns/hour it would take 10 seconds to grow the 30 Angstrom layer. During this period temperature may be varied as much as 300 C along with significant changes in reactor gases. If it takes 20 to 30 seconds to cool the substrate temperature it is apparent that high growth rates have a problem with accurately depositing the desired composition within the layer. It is disclosed that freestanding nitride foils can be used to overcome this problem. As such freestanding nitride foils with volume to area ratios less than 0.01 cm are an embodiment of this invention. Even more preferred the use of freestanding nitride foils with convective thermal time constant less than 1 sec when h is between 1 and 100 W/m2C within a MOCVD, HVPE, or MBE system is disclosed. The use of these foils to create LEDS, solar cells, laser diodes, RF devices, photoelectrochemical cells and power devices is also disclosed.

Figure 17A:
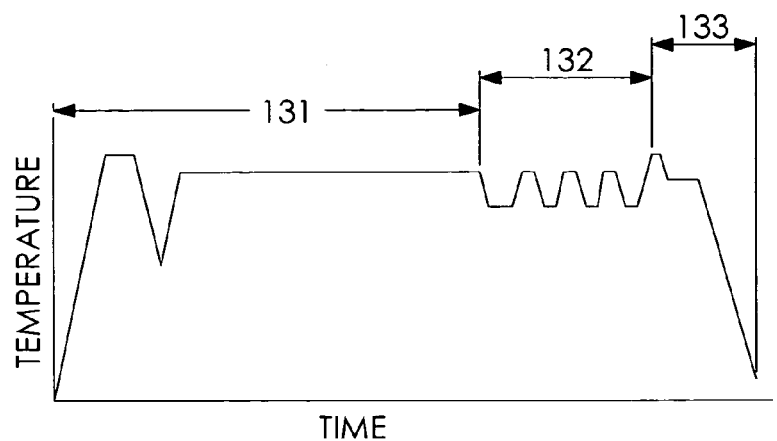
FIG. 17A depicts typical LED growth cycle.
Figure 17B:
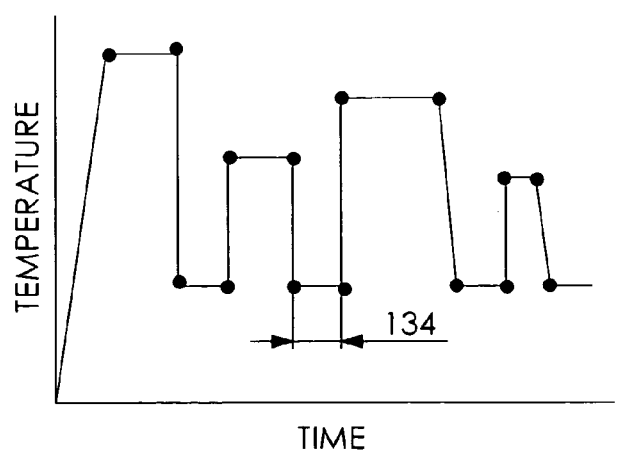
FIG. 17B shows the use of growth interruptions to improve device performance.

FIG. 17A depicts a typical complete growth cycle for a MQW LED. The growth cycle can be divided into 3 main regions, nucleation and n layer growth 131, MQW growth 132, and barrier and p layer growth 133. By using freestanding nitride film, growth 131 can be eliminated and the reactor can be optimized for MQW growth 132 and barrier p layer growth 133. Using prior art conventional methods with large wafers, complete growth cycle can take up to 8 hours with the majority of the time spent in nucleation and n layer growth 131. Additional layers may be added to improve crystal quality or control stresses prior to MQW growth 132. This invention shows how freestanding nitride films with low thermal mass can dramatically reduce this growth cycle times. In addition FIG. 17B depicts how low thermal mass approaches can be used to enable better definition of the layers themselves through the use of rapid growth interruptions 134 between layers. Such an approach in conventional reactors becomes prohibitively expensive. In addition, because process gases cannot be instantly changed within the reactor, composition of each layer are graded and exhibit tails into next layer. By decreasing the thermal time constants, it becomes possible to more cleanly and accurately define the composition, thickness and interfaces between layers. The use of growth interruptions 134 in a rapid thermal growth reactor using freestanding nitride films is a preferred embodiment of this invention.

Figure 18A:
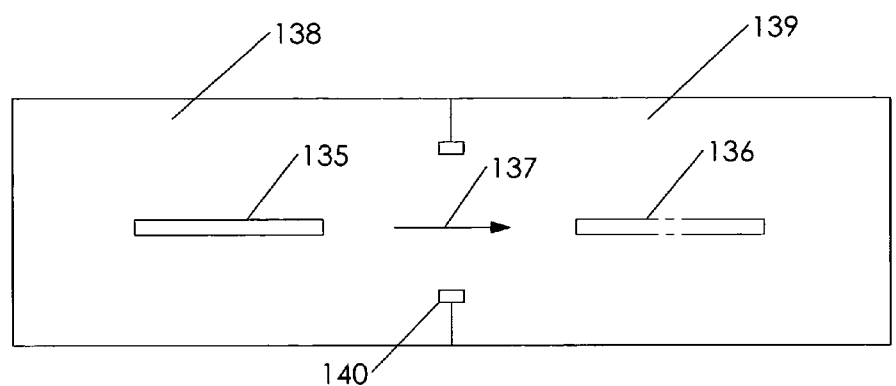
FIG. 18A depicts a rapid thermal multi chamber deposition method based on freestanding nitride films.
Figure 18B:
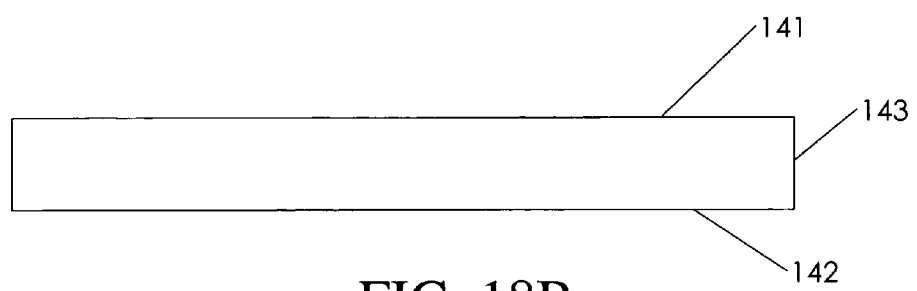
FIG. 18B shows a freestanding nitride film.

FIG. 18A depicts a multi chamber reactor 138 and 139 to further decrease time constant of layered structures. Freestanding nitride film 135 is shuttled from chamber 138 through port 137 into chamber 139. As an example MQW growth may occur within chamber 138 and barrier and p layer growth may occur within chamber 139. Alternately, InGaN layer may occur in chamber 138 and GaN layer may occur within chamber 139. MQWs would be created by shuttling back and forth between the two chambers. The addition of more chambers is also disclosed. FIG. 18B depicts freestanding nitride film 143 and Ga side 141 and N side 142. In all the previous disclosure it should be noted that growth rates and composition is effected by whether Ga side 141 or N side 142 is being grown on. The formation of dual sided devices where the different outputs or device performance is created based on Ga and N deposition differences is also disclosed.

Figure 19A:
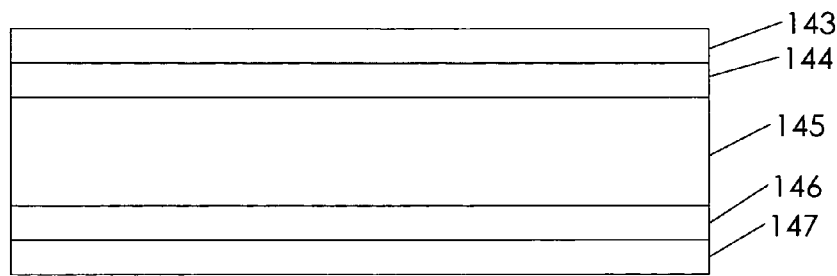
FIG. 19A depicts dual sided freestanding nitride film with multiple depositions.
Figure 19B:
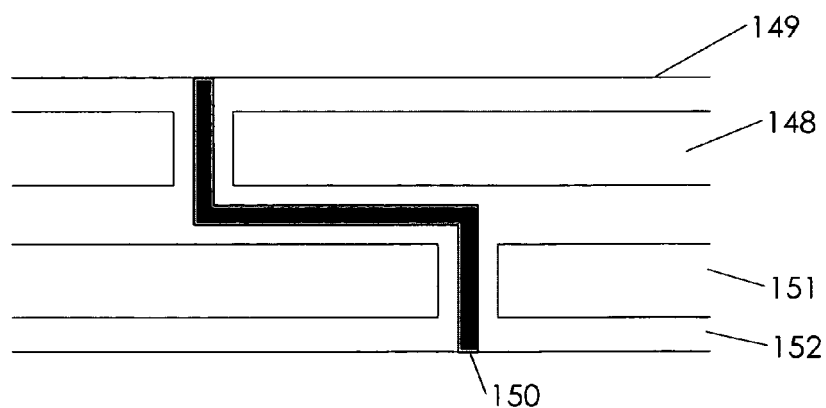
FIG. 19B depicts interconnect means to dual sided device.

FIG. 19A depicts a freestanding nitride film 145 with multiple depositions 143, 144, 146, and 147 on both sides. The growth of multiple layers on both sides of at least one freestanding nitride film 145 is a preferred embodiment of this invention. FIG. 19B depicts how feedthroughs and traces 150 can be used to interconnect multiple freestanding nitride films 148 and 151. Optionally, insulative and semi-insulating layers 149 and 152 may be used to isolate electrically, optically, and mechanically bond the films together.

Figure 20:
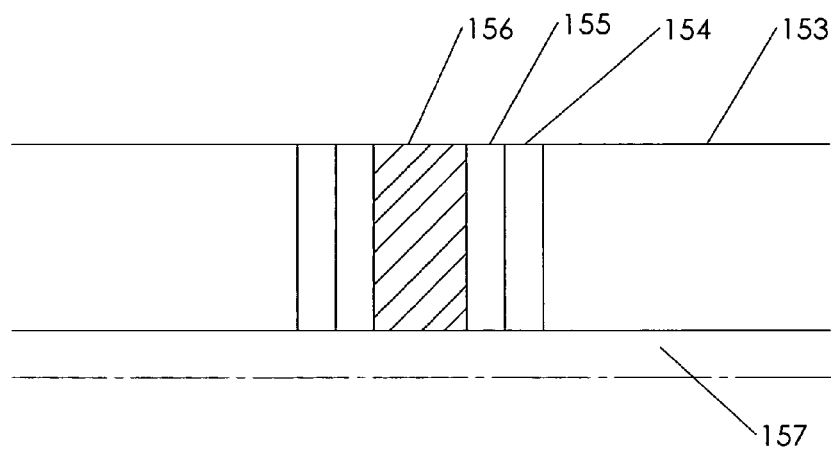
FIG. 20 depicts device growth within freestanding nitride films.

FIG. 20 depicts a freestanding nitride film 153 in which multiple epitaxial layers 155 and 154 are grown within a hole in freestanding nitride film 153. The hole may be formed via chemical means, mechanical means, and laser ablation means. Secondary etching to expose clean crystal planes within the hole may also be used. An interconnect means 156 may optionally be used to form a two or three terminal device with the freestanding nitride film 153 forming one side of the device. Optionally excess growths 157 on one or both surfaces of freestanding nitride film 153 may be removed by mechanical, CMP, and laser ablation.

A preferred process of making a LED, solar cell or microelectronic device utilizing the following steps: (1) Growing low defect density GaN or other useful nitride or oxide layer to a thickness of >10 µms, more preferably ≧20 µm, and, most preferably, ≧30 µm, on a sapphire substrate using HVPE for GaN and/or MOCVD for the nitride layer, optionally where said nitride film has a defect density less than 10E8 cm2. (2) Lifting off said GaN or nitride layer using a DPSS laser with the scanning techniques described previously herein. The lifted off GaN is simultaneously sectioned into square or rectangular foils of sufficient size to be used as growth substrates for fabricating a plurality of devices on them preferably less than 9 cm2, more preferably less than 6.5 square centimeters, and most preferably ≧4 square mm. The thickness of these freestanding pure nitride or oxide substrates is at least 10 µm, preferably at least 20 µm, and more preferably ≧30 µm such that they survive the liftoff process but are also robust enough to handle. (3) Optionally, prior to lifting of said nitride a first device may be grown or fabricated on the top surface in order that a device with different or complimentary characteristics may be grown on the underside after lifting off. (4) These relatively thin nitride or oxide freestanding substrates are then processed in a suitable reactor, more preferably a rapid thermal reactor that is optimized to process freestanding semiconductor substrates of relatively small size preferably less than 9 cm2, more preferably less than 6.5 square centimeters, and most preferably ≧4 square mm. Said reactor is capable of growing HVPE or MOCVD processes and optionally capable of growing on multiple films simultaneously. (5) Devices may be grown on one or both sides of these films in said reactor. To process on only one side a coating may be applied to one side prior to processing or by clamping the film against a platen to restrict growth to the exposed side. To grow on both sides, the freestanding film is secured in the reactor such that both sides are exposed to the growth process.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

The invention claimed is:

1. The method of forming a semiconductor device comprising the steps of:
    growing a freestanding semiconductor alloy film on a substrate; said semiconductor alloy being a nitride alloy or a zinc oxide alloy;
    depositing a first semiconductor layer on the upper surface of a freestanding semiconductor alloy film; said first semiconductor layer being an oxide, a nitride, silicon, an antimonide, a metal, a dielectric or other semiconductor material; said depositing being by a deposition process of MOCVD, HVPE, MBE, CVD, sputter, evaporative, or spincoating;
    removing said freestanding semiconductor alloy film and said first semiconductor layer from said substrate prior to depositing a second semiconductor layer on the lower surface of a freestanding semiconductor alloy film;
    depositing a second semiconductor layer on the lower surface of a freestanding semiconductor alloy film; said second semiconductor layer being an oxide, a nitride, silicon, an antimonide, a metal, a dielectric or other semiconductor material; said semiconductor alloy being a nitride alloy or a zinc oxide alloy; said depositing being by a deposition process of MOCVD, HVPE, MBE, CVD, sputter, evaporative, or spincoating.

2. The method of forming a semiconductor device of claim 1 wherein said freestanding semiconductor alloy film is a nitride alloy film; said first semiconductor layer is a doped zinc oxide alloy which is deposited by epitaxial deposition on said upper surface of said freestanding semiconductor alloy film; and said second semiconductor layer is a doped zinc oxide alloy which is deposited by epitaxial deposition on said lower surface of said freestanding semiconductor alloy film.

3. The method of forming a semiconductor device of claim 1 further comprising the steps of:
    patterning said freestanding semiconductor alloy film; prior to said depositing a first semiconductor layer on the upper surface of a freestanding semiconductor alloy film and prior to depositing a second semiconductor layer on the lower surface of a freestanding semiconductor alloy film.

4. The method of forming a semiconductor device of claim 1 wherein said removing said freestanding semiconductor alloy film from said substrate is by mechanical means, masking means during said growing said freestanding semiconductor alloy film on said substrate, laser scribing and break means, or chemical etching means.

5. The method of forming a semiconductor device of claim 1 wherein said depositing a first semiconductor layer on the upper surface of a freestanding semiconductor alloy film and said depositing a second semiconductor layer on the lower surface of a freestanding semiconductor alloy film are simultaneous.

6. The method of forming a semiconductor device of claim 1 further comprising the steps of:
    holding said freestanding semiconductor alloy film by the upper surface edges and the lower surface edges to allow conductive cooling and radiative cooling; said freestanding semiconductor alloy film being a nitride alloy film with a low thermal mass having a thickness less than 100 microns; said holding said freestanding semiconductor alloy film being prior to said depositing a first semiconductor layer on the upper surface of a freestanding semiconductor alloy film and prior to depositing a second semiconductor layer on the lower surface of a freestanding semiconductor alloy film.

7. The method of forming a semiconductor device of claim 1 wherein said depositing a first semiconductor layer on the upper surface of a freestanding semiconductor alloy film is performed in a first chamber and said depositing a second semiconductor layer on the lower surface of a freestanding semiconductor alloy film is performed in a second chamber.

8. The method of forming a semiconductor device of claim 6 wherein said depositing a first semiconductor layer on the upper surface of a freestanding semiconductor alloy film and said depositing a second semiconductor layer on the lower surface of a freestanding semiconductor alloy film are performed in more than two chambers.

9. The method of forming a semiconductor device of claim 1 wherein said depositing a first semiconductor layer on the upper surface of a freestanding semiconductor alloy film is multiple depositions of semiconductor layers and said depositing a second semiconductor layer on the lower surface of a freestanding semiconductor alloy film is multiple depositions of semiconductor layers.

10. The method of forming a semiconductor device of claim 1 further comprising the steps of:
    depositing said first semiconductor layer on the inside surface of a hole in a freestanding semiconductor alloy film.

11. The method of forming a semiconductor device of claim 10 further comprising the step of:
    forming a hole in a freestanding semiconductor alloy film by chemical means, mechanical means, and laser ablation means; prior to said depositing a semiconductor layer on the inside surface of a hole in a freestanding semiconductor alloy film.

* * * * *